(12) United States Patent
Kanter et al.

(10) Patent No.: US 11,563,450 B1
(45) Date of Patent: Jan. 24, 2023

(54) SYSTEM AND METHOD FOR HIGH RELIABILITY FAST RAID DECODING FOR NAND FLASH MEMORIES

(71) Applicant: KIOXIA Corporation, Tokyo (JP)

(72) Inventors: Ofir Kanter, Haifa (IL); Avi Steiner, Kiryat Motzkin (IL); Hanan Weingarten, Herzliya (IL)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/818,969

(22) Filed: Mar. 13, 2020

(51) Int. Cl.
*H03M 13/45* (2006.01)
*H03M 13/29* (2006.01)
*H03M 13/11* (2006.01)
*G06F 3/06* (2006.01)

(52) U.S. Cl.
CPC ........ *H03M 13/451* (2013.01); *G06F 3/0619* (2013.01); *G06F 3/0653* (2013.01); *H03M 13/1108* (2013.01); *H03M 13/1125* (2013.01); *H03M 13/2942* (2013.01); *G06F 3/0688* (2013.01); *G06F 3/0689* (2013.01)

(58) Field of Classification Search
CPC .............. H03M 13/1111; H03M 13/45; H03M 13/451; H03M 13/1108; H03M 13/1125; H03M 13/2942; G06F 3/0619; G06F 3/0653; G06F 3/0688; G06F 3/0689
See application file for complete search history.

(56) References Cited

U.S. PATENT DOCUMENTS

| | | | | |
|---|---|---|---|---|
| 9,092,353 B1* | 7/2015 | Micheloni | ........... | G06F 11/1068 |
| 9,454,414 B2* | 9/2016 | Micheloni | ............... | G06F 11/00 |
| 9,564,931 B1* | 2/2017 | Nguyen | ............... | H03M 13/116 |
| 9,954,558 B1* | 4/2018 | Steiner | .................. | H03M 13/45 |
| 10,230,396 B1* | 3/2019 | Micheloni | ......... | H03M 13/6583 |
| 10,565,053 B1* | 2/2020 | Hsiao | ................ | H03M 13/6325 |
| 2011/0246136 A1* | 10/2011 | Haratsch | ................. | H04L 1/005 702/181 |
| 2012/0236638 A1* | 9/2012 | Weingarten | .......... | G11C 16/349 365/185.2 |
| 2013/0021178 A1* | 1/2013 | Jaquette | ................ | H03M 5/145 341/67 |
| 2014/0237318 A1* | 8/2014 | Fitzpatrick | .............. | G06F 11/10 714/763 |
| 2018/0048329 A1* | 2/2018 | Ha | .................... | H03M 13/3715 |

* cited by examiner

*Primary Examiner* — Steve N Nguyen
(74) *Attorney, Agent, or Firm* — Foley & Lardner LLP

(57) ABSTRACT

A flash memory system may include a flash memory and a circuit for decoding a result of a read operation on the flash memory using a first codeword. The circuit may be configured to generate an estimated codeword based on a result of hard decoding the first codeword and a result of hard decoding a second codeword. The circuit may be further configured to generate soft information based on the hard decoding result of the first codeword and the estimated codeword. The circuit may be further configured to decode the result of the read operation on the flash memory using the soft information.

20 Claims, 14 Drawing Sheets

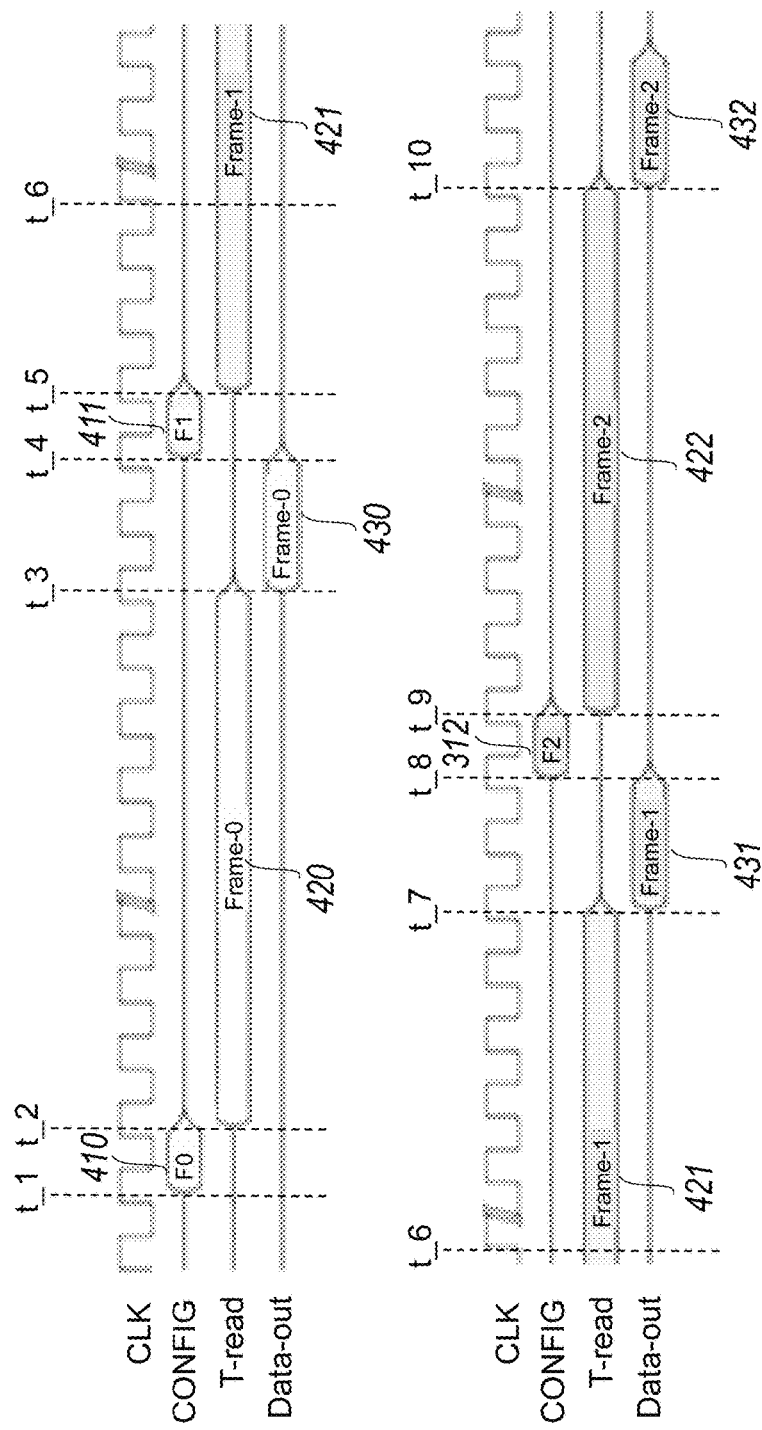
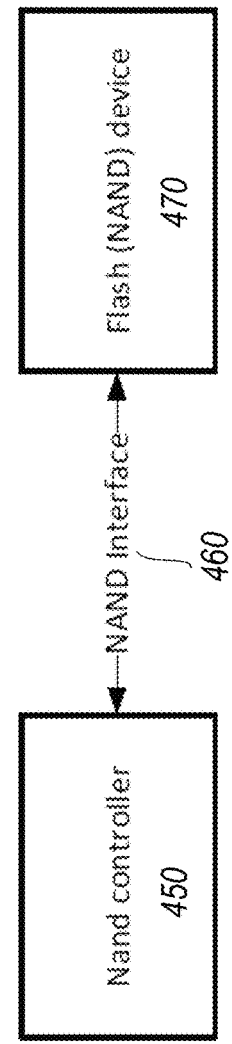
FIG. 4A
FIG. 4B

SYSTEM AND METHOD FOR HIGH RELIABILITY FAST RAID DECODING FOR NAND FLASH MEMORIES

TECHNICAL FIELD

The present embodiments relate generally to system and method for performing operations of a flash memory, and more particularly to system and method for system and method for decoding a result of a read operation on a flash memory using soft information generated based on results of hard decoding.

BACKGROUND

As the number and types of computing devices continue to expand, so does the demand for memory used by such devices. Memory includes volatile memory (e.g. RAM) and non-volatile memory. One popular type of non-volatile memory is flash memory or NAND-type flash. A NAND flash memory array includes rows and columns (strings) of cells. A cell may include a transistor.

Due to different stress conditions (e.g., NAND noise and interference sources) during programming and/or read of the NAND flash memory, there may be errors in the programmed and read output. Improvements in decoding capabilities in such a wide span of stress conditions for NAND flash devices remain desired.

In NAND flash devices, soft sampling may be performed to generate soft information by changing read thresholds and reading a NAND flash device several times. Then, soft decoding is performed based on the soft information generated by the soft sampling. The NAND flash memory can be implemented using a RAID (Redundant Array of Inexpensive Drives or Redundant Array of Independent Drives) structure. Improvements in soft decoding capabilities in RAID for NAND flash devices remain desired.

SUMMARY

The present embodiments relate to system and method for decoding a result of a read operation on a flash memory using soft information generated based on results of hard decoding without performing soft sampling of codewords from channels.

According to certain aspects, embodiments provide a method for decoding a result of a read operation on a flash memory using a first codeword. The method may include generating an estimated codeword based on a result of hard decoding the first codeword and a result of hard decoding a second codeword. The method may further include generating soft information based on the hard decoding result of the first codeword and the estimated codeword. The method may further include decoding a result of a second read operation on the flash memory based on the estimated soft information.

According to other aspects, embodiments provide a flash memory system including a flash memory and a circuit for decoding a result of a read operation on the flash memory using a first codeword. The circuit may be configured to generate an estimated codeword based on a result of hard decoding the first codeword and a result of hard decoding a second codeword. The circuit may be further configured to generate soft information based on the hard decoding result of the first codeword and the estimated codeword. The circuit may be further configured to decode the result of the read operation on the flash memory using the soft information.

BRIEF DESCRIPTION OF THE DRAWINGS

These and other aspects and features of the present embodiments will become apparent to those ordinarily skilled in the art upon review of the following description of specific embodiments in conjunction with the accompanying figures, wherein:

FIG. 4A is a timing diagram illustrating an example timing of soft sampling process;

FIG. 4B is a block diagram illustrating an example system for reading data from a flash device to a controller;

DETAILED DESCRIPTION

According to certain aspects, embodiments in the present disclosure relate to techniques for decoding a result of a read operation on a flash memory using soft information generated based on results of hard decoding without performing soft sampling of codewords from channels.

Before describing problems to be solved by embodiments of the present disclosure, an example soft sampling process, an example soft decoding process, and an example RAID encoding and decoding will be described with reference to FIG. 1 to FIG. 6.

Figure 1:
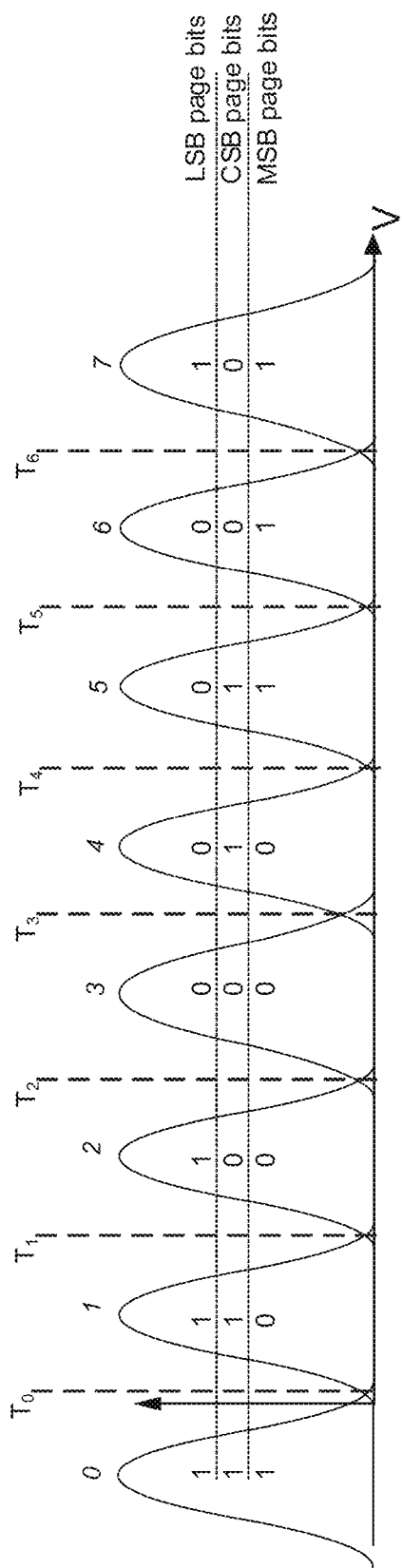
FIG. 1 illustrates threshold voltage distribution in a conventional three bits per cell (bpc) flash device.

FIG. 1 illustrates a superposition of the 8 possible voltage threshold distributions of a three bits per cell (bpc) flash memory device, e.g., a NAND device. The possible voltage threshold (VT) distributions of the cell have eight lobes, corresponding to the 8 different bit combinations of the three bits represented by the charge state of the cell. An MSB (most significant bit) page read requires using reference voltages (or read thresholds) T0, T4, to separate the lobes into those with MSBs of 0 and those with MSBs of 1. For reading CSB (center significant bit) pages the reference voltages T1, T3 and T5 are used. For reading LSB (least significant bit) pages the reference voltages T2 and T6 have to be used. The lower (left) most distribution is known as the erase level.

Due to different NAND noise and interference sources during programming and during read-out, there may be errors in programmed bits and read output. This may be due to programming errors, or errors during read with non-optimal thresholds or following retention/read-disturb stresses, etc. These noise sources result in errors on the information bits that are originally saved to the NAND device. A strong error correction code (ECC) can achieve faster programming, with possibly higher programming errors, under high stress conditions during read-out, and/or with lower complexity digital signal processing (DSP). There are other impairments that may lead to complete erasure of a physical page/row/block in a NAND device, e.g. a block becoming a "bad" block that is no-longer readable. If these impairments cannot be detected during programming, recovery of a non-readable area can be performed by various techniques including a RAID encoding (see FIG. 6), for example.

Figure 2:
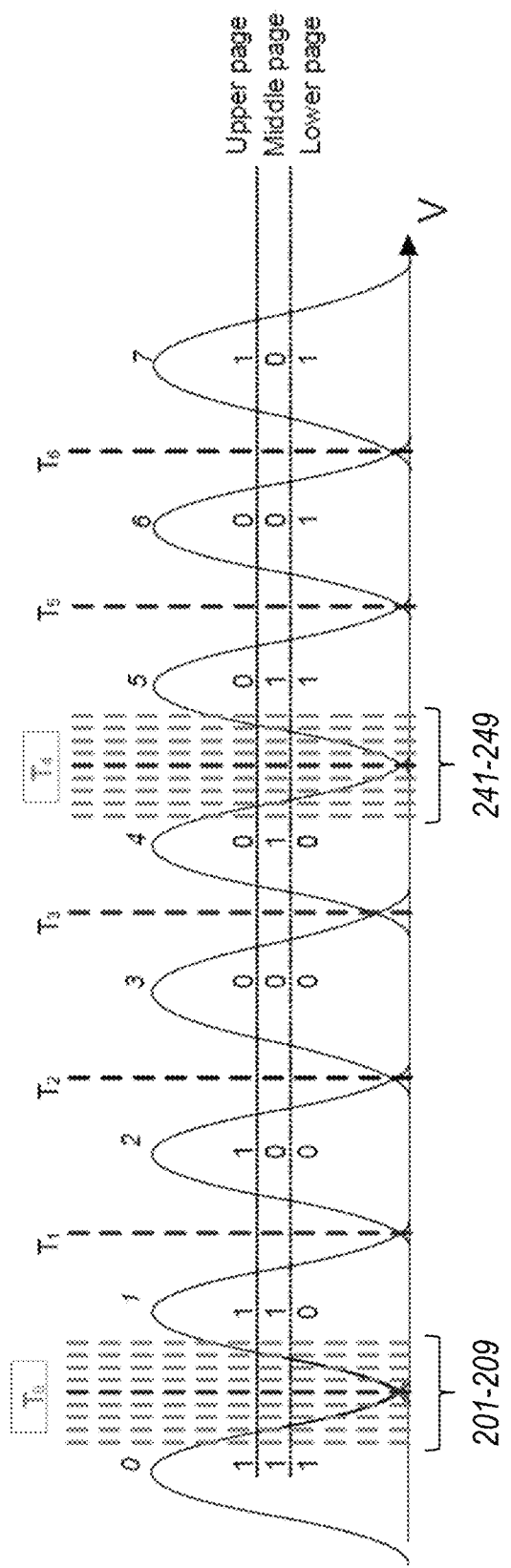
FIG. 2 illustrates an example process of soft sampling of a page of a flash device in a conventional three bpc flash device.

FIG. 2 illustrates an example process of soft sampling of a page of a flash device in a conventional three bpc flash device. In NAND devices, soft sampling is achieved by changing read thresholds and reading the NAND device several times. Soft sampling process may include several reads with different voltage levels around different thresholds. For example, as shown in FIG. 2, soft sampling process of a MSB of a NAND device includes reads with nine voltage levels 201-209 around the threshold T0 and reads with nine voltage levels 241-249 around the threshold T4.

Figure 3:
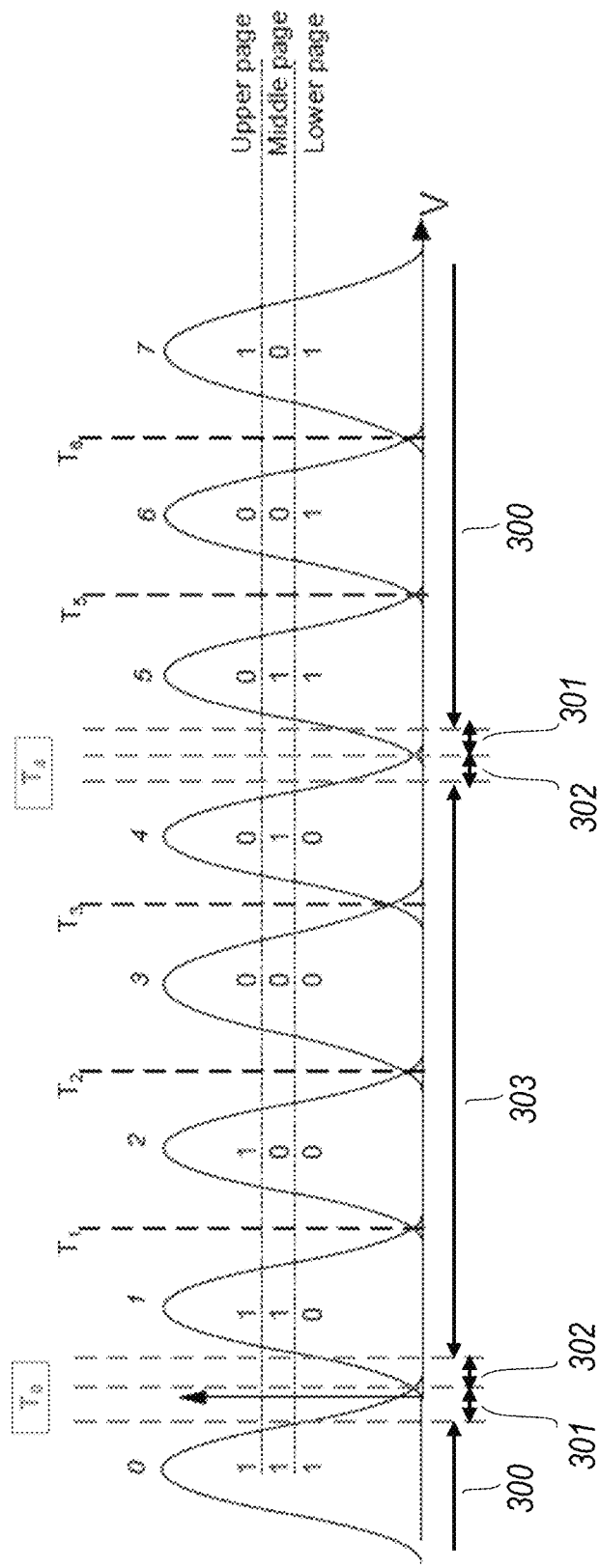
FIG. 3 illustrates another example process of soft sampling of a page of a flash device in a conventional three bpc flash device.

FIG. 3 illustrates another example process of soft sampling of a page of a flash device in a conventional three bpc flash device. As shown in FIG. 3, soft sampling of a MSB of a NAND device can be performed 3 times with different thresholds around each of the thresholds T0 and T4, thereby providing 4 different voltage ranges 300, 301, 302 and 303. For example, the range 300 indicates value "1" with higher confidence level; the range 301 indicates value "1" with lower confidence level; the range 302 indicates value "0" with lower confidence level; and the range 303 indicates value "0" with higher confidence level. These 4 different voltage ranges can be converted to 4 different values (i.e., 2 bits) of LLRs so that soft decoding can be performed. This soft sampling process is referred to as "2 bits soft sampling." A common 2 bits soft decoding can be performed in two phases: in the first phase, 2 bits LLR information is calculated by channel soft sampling, e.g., using the method shown in FIG. 3. In the second phase, 2 bits soft decoding is performed based on the 2 bits LLR information provided by the first phase.

FIG. 4A is a timing diagram illustrating an example timing of soft sampling process, and FIG. 4B is a block diagram illustrating an example system for reading data from a flash device to a controller. In NAND devices, the process of reading data from a flash memory may be composed of three main phases—(1) configuration (CONFIG) phase, (2) T-read phase, and (3) data-out phase. During CONFIG phase, various addresses and thresholds (e.g., block address, page address, read-thresholds) are configured. This phase is short, typically <1 μs. In the T-read phase, the flash device extracts logical values according to cells voltage levels and read-thresholds (as configured). This phase is relatively long. Typical time in TLC (3 bits per cell) devices is about 70 μs, while in QLC (4 bits per cell) devices typical time may be around 120 μs. In the data-out phase, the data is read out from the flash device (e.g., flash device 470 in FIG. 4B) to a controller (e.g., NAND controller 450 in FIG. 4B) through an interface (e.g., NAND interface 460). This phase is relatively short, depending on NAND clock frequency (see "CLK" in FIG. 4A). For example, if the clock frequency is 340 MHz, codeword length is 4584 bytes, NAND interface width is 8 bits, and the device operates in double data rate (DDR) mode, the latency of the data-out phase will be 4584/(340*2), i.e., around 6.7 μs. Therefore, when soft sampling of a MSB of a NAND device is performed 3 times with threshold T0 (see FIG. 3), the soft sampling may need to perform the process of reading data three times. For example, as shown in FIG. 4A, the soft sampling process requires serial steps of: (at t_1) CONF phase for the first threshold (Frame 410)→(at t_2) T-read phase for the first threshold (Frame 420)→(at t_3) Data-out for the first threshold (Frame 430)→(at t_4) CONF phase for the second threshold (Frame 411)→(at t_5) T-read phase for the second threshold (Frame 421)→(at t_7) Data-out for the second threshold (Frame 431)→(at t_8) CONF phase for the third threshold (Frame 412)→(at t_9) T-read phase for the third threshold (Frame 422)→(at t_10) Data-out for the third threshold (Frame 432). Thus, the overall latency for the soft sampling process is order of 3 times T-read (if other shorter time periods are omitted), as shown in FIG. 4A.

Now, an example soft decoding process will be described. While a hard decoder decodes a message based on received bits (based on hard decision), soft input can be obtained by soft sampling, e.g., performing multiple reads from a flash device, where each read operation uses different read thresholds (see FIG. 2 to FIG. 4). The read thresholds may be configured such that soft information or soft metrics, e.g., log-likelihood ratio (LLR), can be computed per bit. An LLR is defined $$LLR(b_i) = \log\left(\frac{P(b_i = 1 \mid y)}{P(b_i = 0 \mid y)}\right) \quad \text{(Equation 1)}$$

where y is a channel output and $b_i$ is the $i^{th}$ bit of a page. The LLR expression can be substantially simplified, for an additive white Gaussian noise (AWGN) channel model. The AWGN is also a good approximation in many cases for lobes' distribution in a flash device (see FIG. 1). By assuming an AWGN channel, $$P(b_i \mid y) = \frac{1}{\sqrt{2\pi\sigma^2}} \exp\left(-\frac{(y - b_i)^2}{2\sigma^2}\right) \quad \text{(Equation 2)}$$

where y is the AWGN channel output. Using Equations 1 and 2, the $LLR(b_i)$ becomes $$LLR(b_i) = \frac{2y}{\sigma^2} \quad \text{(Equation 3)}$$

where the LLR per bit is created during multiple flash reads, as a quantized version of an AWGN channel. In some embodiments, the quantization level per threshold may be directly determined by the number of reads, as a base-two logarithm of a read counter.

After multiple reads have been conducted, once LLRs are available for all bits of codewords, a decoding process may begin. There are many possible approximations for LLR values' mapping for implementation efficiency, such as mapping to fixed point integer values. For product codes (i.e., a product code is n×n arrays where each column and row is a codeword in component code), there are several known decoding algorithms when soft information is available to a decoder. The general approach includes decoding each component code separately to generate output reliabilities per bit, which are applied and used for iterative decoding of the component code. For example, soft decoding of a BCH (Bose, Chaudhuri, and Hocquenghem) component code requires soft information per bit. Iterative soft decoding includes a process of performing soft decoding on some of code components, and applying the most likely corrections under different conditions. One approach for soft decoding is enumeration over low reliability bits, while trying to solve the BCH code per hypothesis [D. Chase, "A class of algorithms for decoding block codes with channel measurement information," IEEE Trans. Inf. Theory, vol. 18, n. 1, 1972, pp. 170-182.]. Other approaches include enumeration on least reliable bits together with assumptions that all errors are within a set of Qxt bits (t is the number of correctable bits, e.g., t=3. Q stands for the Galois field ($2^Q$) that is used for the code elements, e.g., Q=10), and perform erasure decoding. Q and t are part of the parameters of the code, and Qxt is the number of parity bits of the codeword. This approach is known as ordered statistics decoding [M. Fossorier and S. Lin, "Soft-decision decoding of linear block codes based on ordered statistics," IEEE Trans. Inf. Theory, vol. 41, pp. 1379-1396. September 1995]. If the BCH component codes with decoding capability of t<4 are used, then soft decoding may be efficiently implemented in terms of computational complexity, or implemented in hardware implementation, as per hypothesis a solution may directly be computed using a syndrome lookup table (LUT). When performing any type of soft decoding for a component code, it includes creating a list of candidates of the most likely error hypotheses for valid codeword corrections. A soft score for every result of valid codeword can be computed by $$S_{LLR} = \sum_{b_m \in C} |LLR(b_m)| \qquad \text{(Equation 4)}$$

where C is the set of error bits, and $b_m$ is a location of an error bit. Usually, the selected error hypothesis of a soft component decoder has the smallest SLLR score.

Figure 5:
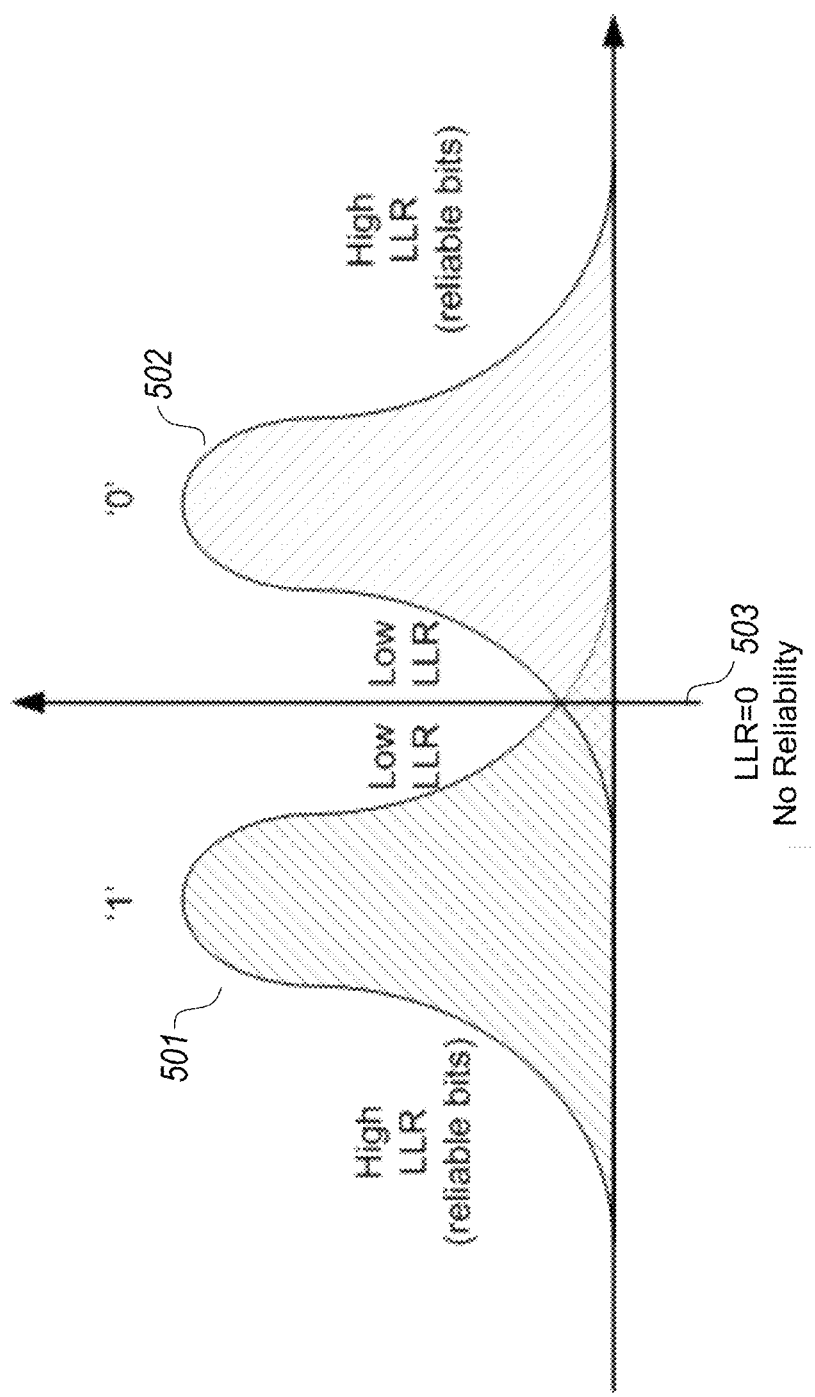
FIG. 5 illustrates an example histogram of log-likelihood ratios (LLRs) over a single threshold.

FIG. 5 illustrates an example histogram of log-likelihood ratios (LLRs) over a single threshold 503. The histogram of LLRs includes a left lobe 501 corresponding to ($b_i$=1) and a right lobe 502 corresponding to ($b_i$=0). LLR has a zero value at the single threshold 503. In the left lobe 501, the left side indicates high LLR values (more reliable bits) for $b_i$=1, while the right side indicates low LLR values (less reliable bits) for $b_i$=1. In the right lobe 502, the left side indicates low LLR values (less reliable bits) for $b_i$=0, while the right side indicates high LLR values (more reliable bits) for $b_i$=0.

LLR has a sign (SIGN) and an absolute value (ABS). Hard errors are erroneous bits with high LLR values. The SIGN (LLR) value represents a hard-bit value, and the ABS(LLR) value represents reliability information of the hard-bit. As shown in FIG. 5, during soft sampling operation, the bits that are close to the optimal threshold are assigned with low LLR values (which represents bits that are less reliable), while bits that are far from the optimal threshold are assigned with high LLR values (which represents bits that are more reliable). Typically, most of the errors have low ABS (LLR) values. The soft information that is provided to a soft decoder may substantially improve the error correction capability compared to hard decoding. In flash devices, in some cases, some of the bits are assigned with high LLR values although their hard bit is erroneous. Erroneous hard bits may occur in a copy back operation in a flash device, in which data is being copied from one location in the flash device to another location in the flash device, without sending out to a host, and without being decoded. Thus, during this copy back operation, bits that are read erroneously may be written as hard errors. This situation impairs the soft decoding, and causes degradation in soft decoding capabilities.

Figure 6:
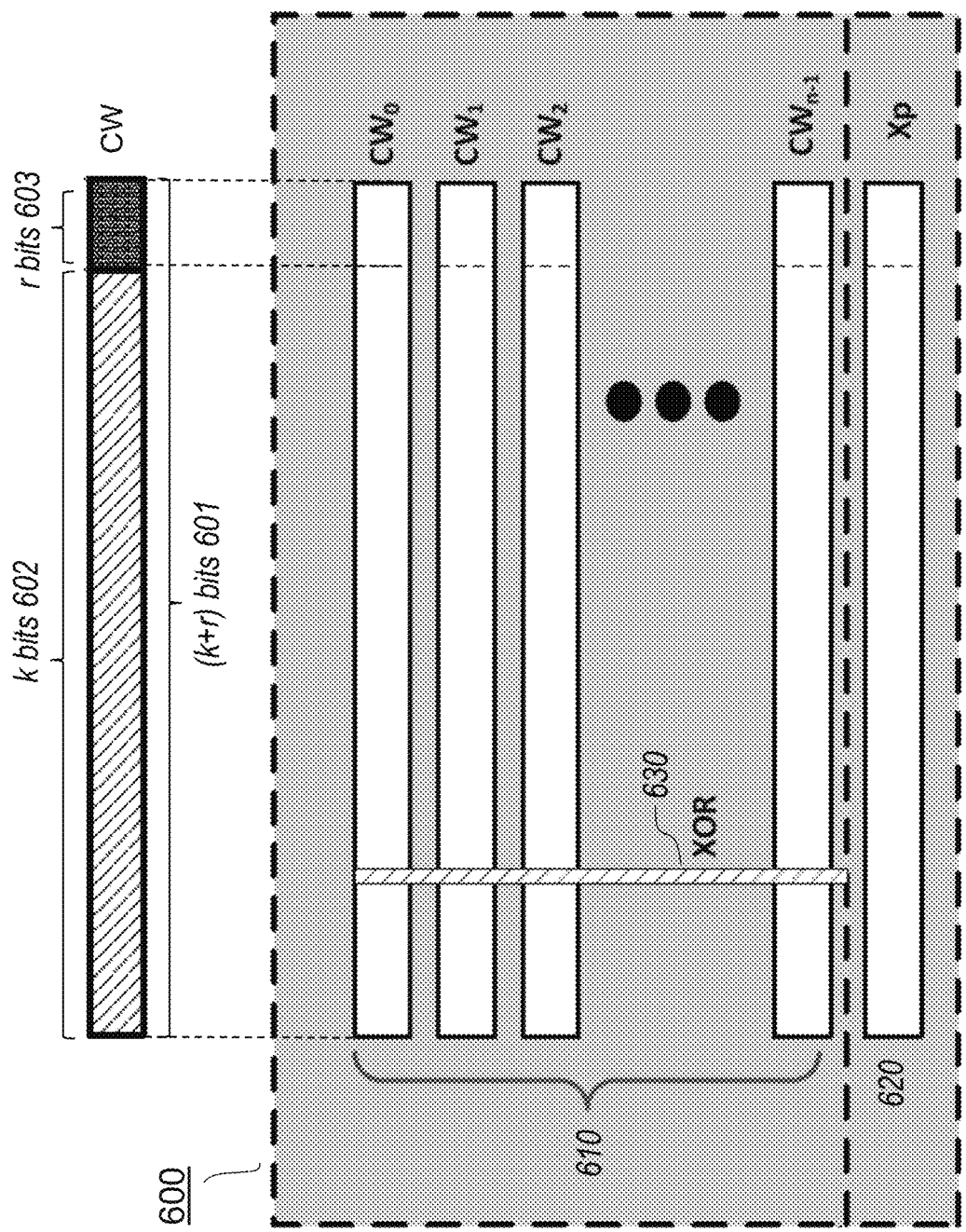
FIG. 6 illustrates an example codeword structure in a RAID system and an example process of RAID encoding and decoding.

FIG. 6 illustrates an example codeword structure in a RAID system 600 and an example process of RAID encoding/decoding. RAID encoding/decoding is used for increasing reliability and decoding capability at high BER with a low complexity additional encoding, and a low complexity decoding of long codewords effectively. An example for such encoding can be creating a long codeword using short codewords (e.g., n short codewords 610 including codewords $CW_0$-$CW_{n-1}$ in FIG. 6) and also storing a result of exclusive or (XOR) 630 of all short codewords $CW_0$-$CW_{n-1}$ as an additional short codeword (e.g., parity codeword Xp 620 in FIG. 6). This encoding can reduce the overall code-rate, but its impact may be very small for XOR with many codewords. This approach is known as RAID coding [Patterson, David; Gibson, Garth A.; Katz, Randy (1988). A Case for Redundant Arrays of Inexpensive Disks (RAID). SIGMOD Conferences]. The RAID approach originates from hard drives, which can be used as redundancy storage for allowing recovery of failed disks. There are many known solutions for redundant storage using RAID encoding with an overhead that depends on the expected system stability and failure rate. A code rate of a codeword is defined by a ratio of its information content, called payload, to the overall size of the codeword. For example, as shown in FIG. 6, for a codeword 601 that contains k bits 602 and r redundancy bits 603, the code rate is defined by R=k/(k+r). The common encoding methods are not very well suited to support high rate codes when both hard and soft decoding are considered. For example, for conventional low-density parity-check (LDPC) codes for very high rates (say 0.9), the code length tends to be considerable, resulting in a very complex and costly implementation.

Referring to FIG. 6, in the RAID system 600, there are n short codewords 610 ($CW_0$-$CW_{n-1}$) where each short codeword has a code rate R, and a parity codeword 620 (Xp) which is an XOR of all other codewords ($CW_0$-$CW_{n-1}$). In this case, the overall encoding rate $R_{raid}$ of the RAID protected data is $$R_{raid} = \frac{n}{(n+1)} \cdot R \qquad \text{(Equation 5)}$$

which is very close to R for a large number n. FIG. 6 illustrates a simple RAID encoding which is performed over short codewords, where each codeword may be stored in different pages, or blocks or dies of a single storage NAND memory, and the parity codeword may be stored on the n-th device. The RAID encoding scheme can be defined as $$x_p = x_0 \oplus x_1 \oplus x_2 \oplus \ldots \oplus x_{n-1} \quad \text{(Equation 6)}$$

where $x_i$ is a short codeword, and $x_p$ is the parity codeword generated by bitwise XOR of all short codewords. In linear codes, the parity codeword $x_p$ is also a valid codeword, and may also be denoted by $x_n$. In case that one component ('i' component) cannot be decoded (due to high BER), and all other components in RAID are decoded, XOR operation can be used, and fix all errors in the 'i' component. However, in case that one component ('i' component) cannot be decoded (due to high BER), and more than one component in RAID cannot be decoded successfully, XOR operation cannot be used in order to fix errors.

It is possible to combine information from a target codeword and RAID in order to obtain a better estimator than the target codeword. The paper [E. Sharon, I. Ilani, I. Alrod "Leveraging RAID for Soft BCH Decoding", 10th annual non-volatile memories Workshop (NVMW), San-Diego, Mar. 10-12, 2019] describes a simple method of combining 2 bits information from a target codeword with 1 bit information from an XOR estimator codeword, and performing hard decoding on the combined codeword.

Now, problems to be solved by embodiments of the present disclosure will be described.

As shown in FIG. 2 and FIG. 3, soft sampling process of a page of a flash device requires a number of reads with different voltage levels, thereby causing a significant time delay. For example, the overall latency for soft sampling process may be order of 3 times T-read time (e.g., the overall latency may be 250 μs~400 μs), as demonstrated in FIG. 4.

Moreover, during operations in a flash device (a copy back operation, for example), bits that are read erroneously may be written as hard errors. This situation impairs the soft decoding, and causes degradation in soft decoding capabilities.

Furthermore, in a RAID encoding/decoding scheme, in case that a target codeword among n codewords cannot be decoded (due to high BER, for example) and other codewords (which are more than one codeword) in RAID also cannot be decoded successfully, XOR operation cannot be used to fix errors in the target codeword.

To solve these problems, according to certain aspects, embodiments in the present disclosure relate to methods for obtaining higher error correction capability from RAID decoding based on hard decoding of each element of the RAID and combining RAID information with information of a target codeword to provide soft information for the target codeword so that soft decoding can perform correction of high raw-BER (bit error rate) pages using the soft information. In some embodiments, the soft information may be created without performing soft sampling of channel.

In some embodiments, a method for obtaining high error correction capability in RAID decoding may include (1) extracting hard information for a target codeword; (2) generating an estimated codeword, which is based on hard information of all codewords other than the target codeword in RAID; (3) generating a combined codeword with 2 bits soft information, which is based on the target codeword and the estimated codeword, by combining target codeword and the estimated codeword; and (4) generating a new candidate codeword with soft information (e.g., 2 bits LLR).

In some embodiments, a method of soft decoding in RAID may include two phases. In the first phase, 2 bits LLR information may be prepared by combining information from a target short codeword and information from the other short codewords in the RAID. In the second phase, 2 bits soft decoding may be performed based on the 2 bits LLR information provided by the first phase.

In some embodiments, low latency of the process of creating soft information for the candidate codeword can be achieved by organizing all or some RAID components in a flash device in a way that they could be extracted in parallel. In some embodiments, soft information can be optimally weighted according to the number of failed codewords in RAID in order to improve error correction capability. In some embodiments, in generating soft information for the candidate codeword, dynamic re-ordering of codewords in RAID (successive RAID decoding) can be performed for improved reliability (see FIG. 12 and FIG. 13). In some embodiments, a trade-off between the total code rate $R_{RAID}$ and the error correction capability of RAID decoding can be utilized by adjusting the total code rate $R_{RAID}$ and the number of codewords in RAID. In some embodiments, the target codeword or other codewords in RAID that failed to be decoded can be partially decoded or partially fixed, in order to improve error correction capability.

According to certain aspects, embodiments in the present disclosure relate to a method for decoding a result of a read operation on a flash memory using a first codeword. The method may include generating an estimated codeword based on a result of hard decoding the first codeword and a result of hard decoding a second codeword. The method may further include generating soft information based on the hard decoding result of the first codeword and the estimated codeword. The method may further include decoding a result of a second read operation on the flash memory based on the estimated soft information.

According to certain aspects, embodiments in the present disclosure relate to a flash memory system including a flash memory and a circuit for decoding a result of a read operation on the flash memory using a first codeword. The circuit may be configured to generate an estimated codeword based on a result of hard decoding the first codeword and a result of hard decoding a second codeword. The circuit may be further configured to generate soft information based on the hard decoding result of the first codeword and the estimated codeword. The circuit may be further configured to decode the result of the read operation on the flash memory using the soft information.

Embodiments in the present disclosure have at least the following advantages and benefits.

First, embodiments in the present disclosure can provide improved or increased reliability in RAID via 2 bits soft decoding in addition to providing erasure recover capability of the RAID. For example, in case that a target codeword among n codewords cannot be decoded and other codewords (which are more than one codeword) in RAID also cannot be decoded successfully, embodiments in the present disclosure can fix errors in the target codeword.

Second, embodiments in the present disclosure can provide a low latency method for computation of 2 bits LLR for a new codeword candidate without performing soft sampling of codewords from channels which would cause a significant time delay. Without performing soft sampling, methods for computation of soft information can utilize a simple implementation in hardware or software. A low latency method for computation of soft information for a candidate codeword can be provided by organizing all or some RAID component in a flash device in a way that they could be extracted in parallel.

Third, embodiments in the present disclosure can provide higher error correction capability, higher endurance and better resilience to retention and read-disturb stresses compared to single component hard decoding or 2-bits soft decoding. For example, soft decoding methods according to some embodiments can provide higher error correction capability than that of a common 2 bits soft decoding because there is no degradation in error correction capability in case of hard errors, as exist in the common 2 bits soft decoding. Soft decoder weighting can be optimized according to the number of failed codewords in RAID in order to improve error correction capability. A new candidate codeword generated according to some embodiments can have higher resolution information because of combination of the target codeword and other failed codewords, and thus, when obtaining soft decoding on the new candidate codeword, the error correction capability results can be improved compared to those of the original target codeword. According to some embodiments, in generating a new candidate codeword, dynamic re-ordering (successive-raid-decoding) of codewords in RAID can be performed to improve the overall error correction capability and reliability.

Figure 7:
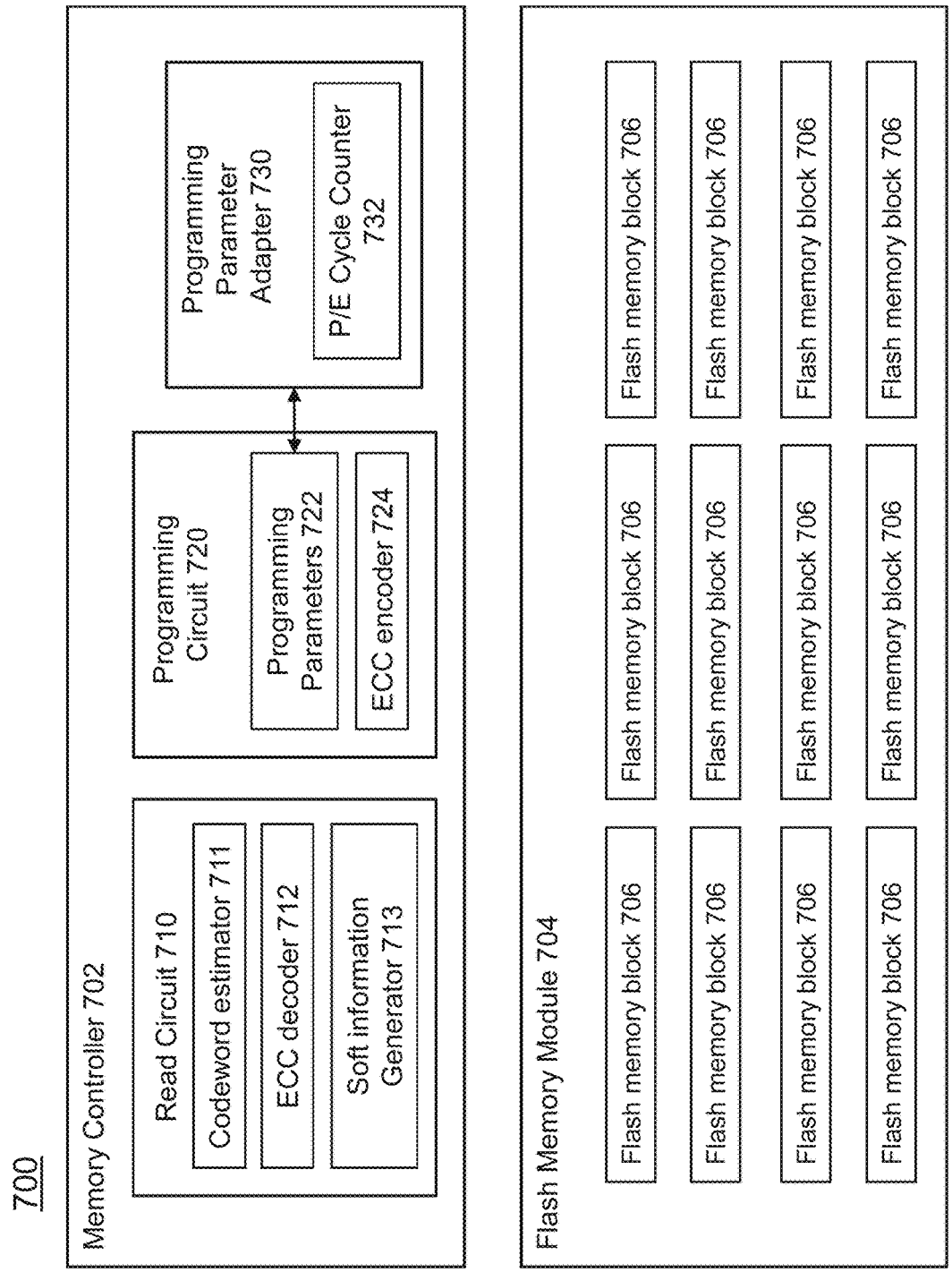
FIG. 7 is a block diagram illustrating an example flash memory system according to some embodiments.

FIG. 7 is a block diagram illustrating an example flash memory system 700 according to some embodiments, which can perform any of the methods described in the present disclosure.

The flash memory system 700 may include a flash memory module or flash memory device 704 and a memory controller 702. The flash memory module 704 may include multiple flash memory blocks 706, each of which includes multiple flash memory rows/pages (not shown). In some embodiments, each of the multiple flash memory rows/pages may have a plurality of cells. Additionally or alternatively, the module 704 can comprise or be implemented using a plurality of dies, each of the dies containing a plurality of the blocks 706.

The memory controller 702 may include a read circuit 710, a programming circuit (e.g. a program DSP) 720 and a programming parameter adapter 730. As shown in FIG. 7, the adapter 730 can adapt the programming parameters 722 used by programming circuit 720 as described above. The adapter 730 in this example may include a Program/Erase (P/E) cycle counter 732. Although shown separately for ease of illustration, some or all of the adapter 730 can be incorporated in the programming circuit 720. In some embodiments, the read circuit 710 may include a codeword estimator 711, an ECC decoder 712 and/or a soft information generator 713. In some embodiments, the programming circuit 720 may include an ECC encoder 124. Embodiments of memory controller 702 can include additional or fewer components such as those shown in FIG. 7.

In some embodiments, a flash memory system (e.g., the flash memory system 700 in FIG. 7) may include a cell flash memory (e.g., the flash memory module 704 or a flash memory block 706 in FIG. 1) and a circuit (e.g., the read circuit 710 or the programming circuit 720 in FIG. 1) for performing operations of the plurality of cells. In some embodiments, the flash memory module 704 may have a plurality of cells. In some embodiments, each of the flash memory blocks 106 may have a plurality of cells. In some embodiments, the codeword estimator 711 of the read circuit 710 may be configured to generate an estimated codeword based on a result of hard decoding a target codeword and a result of hard decoding codewords other than the target codeword. Methods of generating an estimated codeword by the codeword estimator 711 according to some embodiments will be described below with reference to FIG. 9 to FIG. 13. In some embodiments, the soft information generator 713 of the read circuit 110 may be configured to generate soft information based on the estimated codeword generated by the codeword estimator 711 and the target codeword. Methods of generating soft information by the soft information generator 713 according to some embodiments will be described below with reference to FIG. 9 to FIG. 13. The read circuit 710 may be configured to perform a read operation on the first cell and decode, via the ECC decoder 712, a result of the read operation on the first cell based on the soft information.

In some embodiments, the cell flash memory (e.g., the flash memory module 104 or a flash memory block 706 in FIG. 1) may include rows and columns of the plurality of cells. In some embodiments, a flash memory block 706 may include a plurality of pages (not shown) and a page may be defined as cells linked with the same word line, which correspond to a row of cells. In some embodiments, neighboring cells of a target cell are cells adjacent to the target cell. For example, each of a first neighboring cell and a second neighboring cell (of a first cell) may be positioned at the same column as a column of the first cell and at a row adjacent to a row of the first cell.

Figure 8:
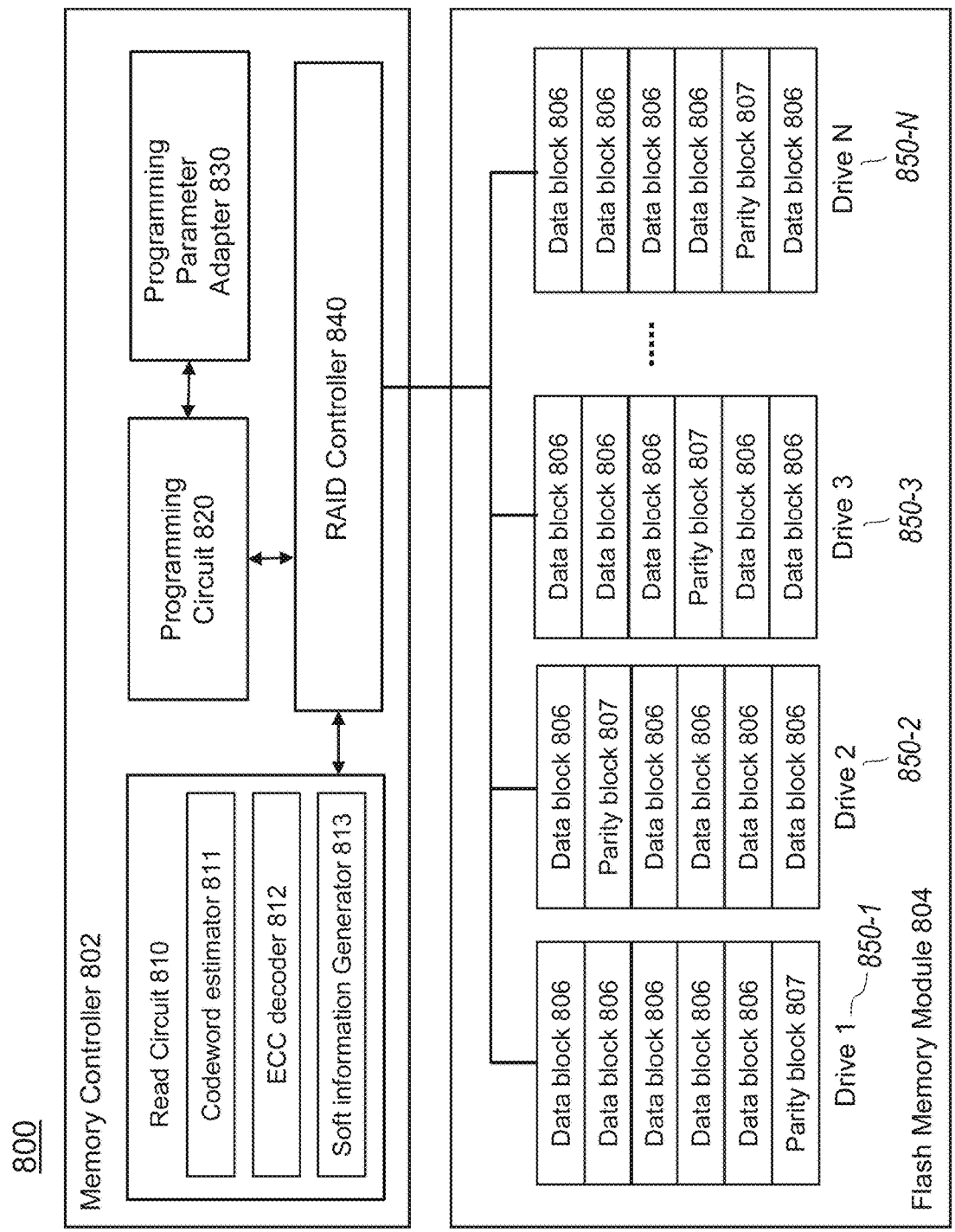
FIG. 8 is a block diagram illustrating an example flash memory system using a RAID (Redundant Array of Inexpensive Drives or Redundant Array of Independent Drives) structure, according to some embodiments.

FIG. 8 is a block diagram illustrating an example flash memory system using a RAID (Redundant Array of Inexpensive Drives or Redundant Array of Independent Drives) structure, according to some embodiments, which can perform any of the methods described in the present disclosure.

The flash memory system 800 may include a flash memory module or flash memory device 804 and a memory controller 802. The flash memory module 804 may include RAID which includes multiple redundant blocks in different drives (e.g., drive 1 (850-1) to drive N (850-N) in FIG. 8). Each drive may include a plurality of data blocks 806 and at least one parity block 807. In some embodiments, the RAID of the flash memory module 804 may be configured to stripe block-level data (e.g., data in data blocks 806) across drives of the RAID (e.g., drives 1-N) and write parity data (e.g., parity data in parity blocks 807) equally across all drives.

The memory controller 802 may include a read circuit 810, a programming circuit 820 and a programming parameter adapter 830, which are similarly configured to the read circuit 710, programming circuit 720 and programming parameter adapter 730 of the memory controller 702, respectively. In some embodiments, the read circuit 810 and the programming circuit 820 perform operations (e.g., encoding or decoding operations) on the blocks in drives 1-N via a RAID controller 840. The RAID controller 815 may be hardware (e.g., a circuit or a RAID card), firmware or software that can control or manage data redundancy between drives (e.g., Drives 1-N in FIG. 8) and/or performance of the RAID of the flash memory module 804. In some embodiments, the read circuit 812 may include a codeword estimator 811, an ECC decoder 812 and/or a soft information generator 813 which are similarly configured to the codeword estimator 711, ECC decoder 712 and/or soft information generator 713 of the read circuit 710, respectively. In some embodiments, the codeword estimator 811 of the read circuit 810 may be configured to generate an estimated codeword based on a result of hard decoding a target codeword stored in a data block in a drive (e.g., a target data block 806 in the drive 1) and a result of hard decoding codewords other than the target codeword stored in data blocks in that drive (e.g., data blocks 806 other than the target data block in the drive 1). Methods of generating an estimated codeword by the codeword estimator 811 according to some embodiments will be described below with reference to FIG. 9 to FIG. 12. In some embodiments, the soft information generator 813 of the read circuit 810 may be configured to generate soft information based on the estimated codeword generated by the codeword estimator 811 and the target codeword (e.g., the target data block 806 in the drive 1). Methods of generating soft information by the soft information generator 813 according to some embodiments will be described below with reference to FIG. 9 to FIG. 13. Embodiments of memory controller 802 can include additional or fewer components such as those shown in FIG. 8.

Figure 9:
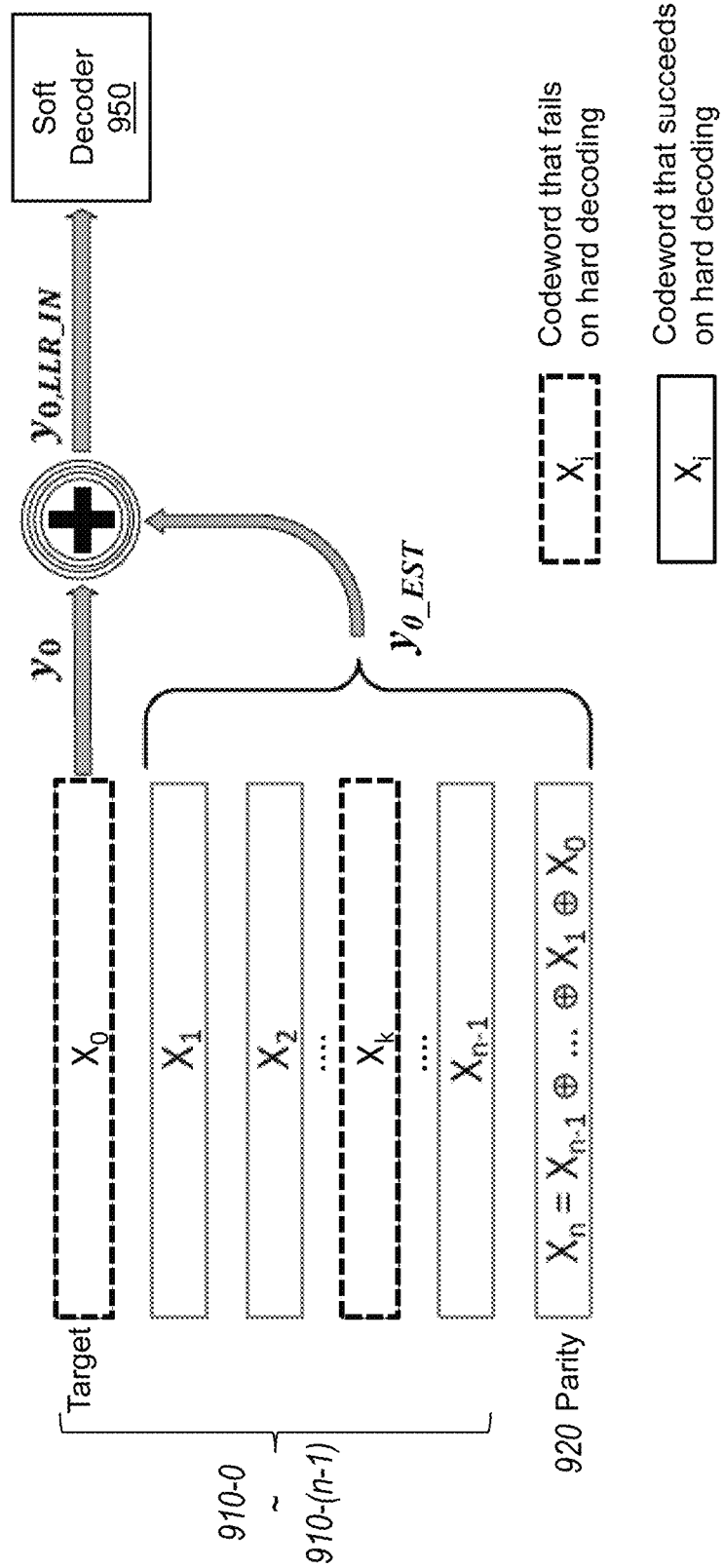
FIG. 9 illustrates an example process of generating soft information based on hard decoding results in a RAID system, according to some embodiments.

FIG. 9 illustrates an example process of generating soft information based on hard decoding results in a flash memory system, according to some embodiments, which can perform any of the methods described in the present disclosure.

A hard-decoding based soft decoding in a flash device according to some embodiments of the present disclosure may create or generate a new codeword (e.g., soft information) from codewords stored in the flash drive and perform soft decoding based on the new codeword. In the following descriptions, systems and methods of hard-decoding based soft decoding will be described with the assumption that codewords are stored in one or more drive in RAID (see FIG. 8). However, embodiments of the present disclosure are not limited to a flash device including a RAID structure. In some embodiments, hard-decoding based soft decoding may be implemented in a flash device that does not include a RAID structure (e.g., the flash memory module 704 in FIG. 7) by implementing data blocks and parity blocks separately in the flash device.

Referring to FIG. 9, in some embodiments, a plurality of codewords 910-0 to 910-$(n-1)$ (e.g., $x_0$-$x_{n-1}$) may be stored in data blocks in a drive of RAID (e.g., data block 806 in drive 1 in FIG. 8) and a parity codeword 920 (e.g., $x_n$) may be stored in a data block in that drive of RAID (e.g., parity block 807 in drive 1 in FIG. 8). In some embodiments, decoding of a target codeword, e.g., $x_0$, stored in a data block of RAID (e.g., data block 806 in drive 1 in FIG. 8) may fail on hard decoding, and the other codewords e.g., $x_1$-$x_{n-1}$, stored in other data blocks of RAID (e.g., data blocks in drive 1 other than that of the target codeword in FIG. 8) can be used for successfully recovering the failed target codeword. In some embodiments, the target codeword may be combined with the other codewords in RAID, such that a new candidate codeword can be created or generated with soft information (e.g., 2 bits soft information). In some embodiments, the soft information can be generated without implementing soft sampling process to the target codeword (e.g., $x_0$). In some embodiments, the generated soft information may be provided to a soft decoder (e.g., a soft decoder 950 in FIG. 9, the ECC decoder 712 in FIG. 7, the ECC decoder 812 in FIG. 8) and the soft decoder can perform soft decoding of the target codeword (e.g., $x_0$) more reliably than using soft information generated only based on the target codeword. This method will be explained through the following example:

It is assumed that the bits of $x_i \in \{0,1\}$ and that a noise vector $n_i$ can represent a continuous noise. The noise may be either additive white Gaussian noise (AWGN), or any distribution corresponding to a NAND device or stress conditions. For example, without loss of generality, a target codeword $x_0$ fails on hard decoding, and when attempting to read and hard decode all the other codewords of the RAID (e.g., $x_1$-$x_{n-1}$), only $x_k$ $(1 \le k \le (n-1))$ fails on hard decoding, as shown in FIG. 9. An erroneous codeword $y_i$ corresponding to codeword $x_i$ may be defined as:

$$\hat{x}_i = (2x_i - 1) + n_i, \text{ and } y_i = \begin{cases} 1 & \hat{x}_i > 0 \\ 0 & \text{else} \end{cases} \quad \text{(Equation 7)}$$

Now, from all the codewords that decoded successfully (e.g., $x_1$-$x_{n-1}$ except $x_k$) and the erroneous codeword $y_k$, an estimated version of $x_0$, denoted by $y_{0\_EST}$, can be computed by:

$$y_{0\_EST} = (x_1 \oplus x_2 \ldots \oplus x_{k-1} \oplus x_{k+1} \ldots \oplus x_n) \oplus y_k \quad \text{(Equation 8)}$$

In some embodiments, information from the (erroneous) target codeword $y_0$ and the estimated codeword $y_{0\_EST}$ may be optimally combined to create or generate a new candidate codeword $y_{0,LLR\_IN}$ as soft information (e.g., LLRs) that is to be input to soft decoders. In some embodiments, the soft information $y_{0,LLR\_IN}$ as LLRs may be computed by:

$$y_{0,LLR_{IN}} = (2y_0 - 1) \cdot \begin{cases} L_a & y_0 \ne y_{0\_EST} \\ L_b & y_0 = y_{0\_EST} \end{cases} \quad \text{(Equation 9)}$$

where $L_a$ is a positive scalar or positive scalars corresponding to LLRs of different hard decisions between the target codeword and the estimated codeword, and $L_b$ is a positive scalar or positive scalars corresponding to LLRs of similar hard decisions between the target codeword and the estimated codeword. A numerical example that can be used (based on empirical LLR characterization) is given below:

$$y_{0,LLR_{IN}} = (2y_0 - 1) \cdot \begin{cases} 2 & y_0 \ne y_{0\_EST} \\ 8 & y_0 = y_{0\_EST} \end{cases}$$

In some embodiments, the above-described examples can be extended and implemented as a method of a hard decoding based soft decoding in RAID (hereinafter "HB_RAID") including the following method steps (without loss of generality):

1. Determine that the target codeword $x_0$ fails on hard decoding, and obtain values of $y_0$ (which is an erroneous version of $x_0$);
2. Perform hard decoding on $x_1 \ldots x_n$ (e.g., all other codewords in RAID);
3. Determine that codewords $x_1 \ldots x_p$ fail on hard decoding, and obtain values of $y_1 \ldots y_p$ (which are erroneous versions of $x_1 \ldots x_p$);
4. Determine that codewords $x_{p+1} \ldots x_n$ are decoded successfully, and extract or obtain values of $x_{p+1} \ldots x_n$;
5. Calculate or compute an estimated codeword $y_{0\_EST}$ by performing XOR operations as follows:

$$y_{0\_EST} = (y_1 \oplus y_2 \ldots \oplus y_p \oplus x_{p+1} \ldots \oplus x_n) \quad \text{(Equation 10)}$$

6. Calculate or compute a new candidate codeword $y_{0,LLR\_IN}$ using Equation 9.

In some embodiments, in calculating the new candidate codeword (or the soft information), $y_{0,LLR\_IN}$ using Equation 9, while the sign of the new candidate codeword is set according to the sign of the target codeword (e.g., by the expression $(2y_0-1)$ in Equation 9), and the absolute value ABS ($y_{0,LLR\_IN}$) may be set to a value of $L_b$ or $L_a$. In some embodiments, ABS ($y_{0,LLR\_IN}$) may be set to a high value (that represents high reliability information) in case that the target codeword and the estimator codeword have the same or similar sign (i.e., in case of "agreement"). On the other hand, ABS ($y_{0,LLR\_IN}$) may be set to a low value (that represents low reliability information) in case that the target codeword and the estimator codeword have different signs from each other (i.e., in case of "disagreement"). See FIG. 10 which shows example ABS ($y_{0,LLR\_IN}$) values. In some embodiments, a value set as ABS ($y_{0,LLR\_IN}$) in case of disagreement may be lower than a value set as ABS ($y_{0,LLR\_IN}$) in case of agreement.

Figure 10:
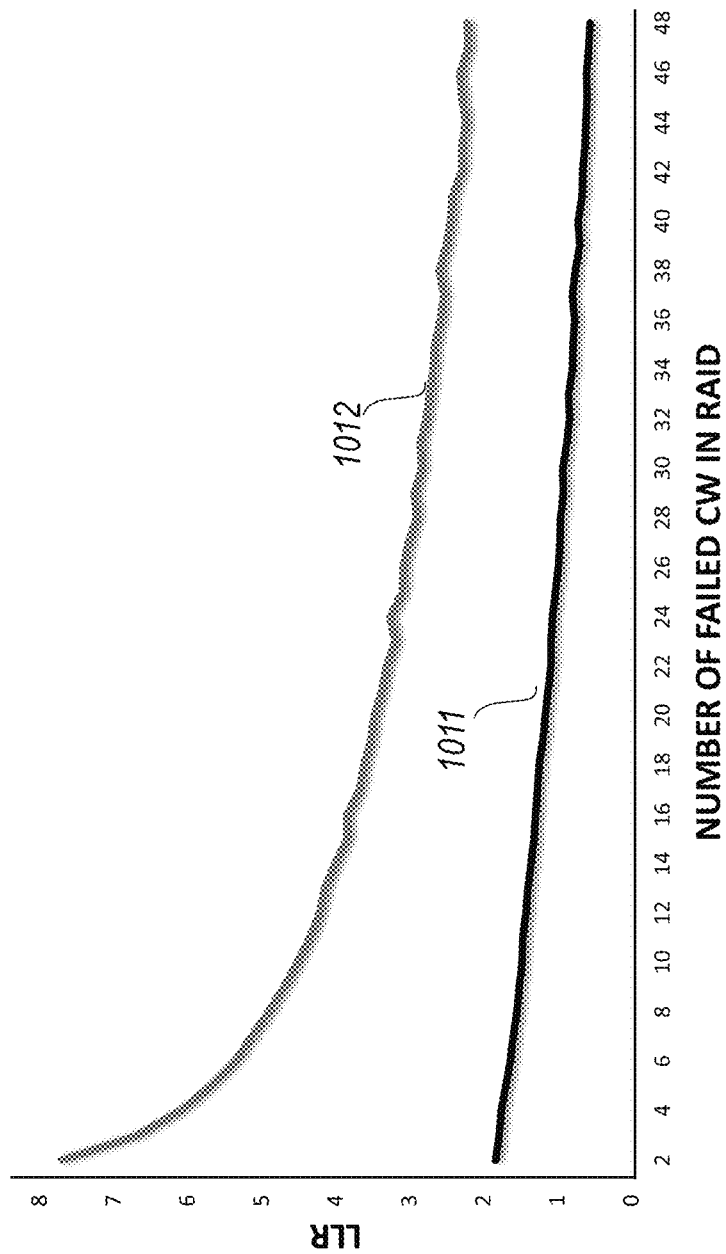
FIG. 10 is a diagram illustrating an example soft information according to some embodiments.

FIG. 10 is a diagram illustrating an example soft information according to some embodiments. In some embodiments, the values for $L_a$ and $L_b$ may be set according to the number of failed codewords in the array. Generally speaking, the less number of failed codewords in the array, the estimated codeword information is more reliable. FIG. 10 shows a numerical example of empirical ABS ($y_{0,LLR\_IN}$) values of estimated codewords based on empirical LLR characterization. The line 1012 indicates ABS (LLR) values for $L_a$ corresponding to the number of failed codewords in RAID. The line 1013 indicates ABS (LLR) values for $L_b$ corresponding to the number of failed codewords in RAID.

In some embodiments, the HB_RAID method may be composed of two phases. In the first phase, 2 bits LLR information may be prepared by combining information from the target (short) codeword and information from the other (short) codewords in RAID. In the second phase, 2 bits soft decoding may be performed based on the 2 bits LLR information provided by the first phase. In contrast, a conventional 2 bits soft decoding may be composed of two phases. In the first phase, the LLR is calculated by channel soft sampling, and in the second phase, 2 bits soft decoding is performed based on the 2 bits LLR information provided by the first phase of the conventional 2 bits soft decoding.

The error correction capabilities of HB_RAID according to some embodiments is improved over the error correction capability achieved by hard decoding or by a conventional 2 bits soft decoding. This gain can be achieved because the HB_RAID combines the information from both the target codeword and other codewords from RAID. The error correction capabilities of HB_RAID according to some embodiments is even more improved over the error correction capability achieved by a conventional 2 bits soft decoding, when some of the errors are hard errors. When hard-errors impairs soft decoding in case of performing a copy-back operation, for example, because HB_RAID does not perform soft sampling at all, the process of generating the new candidate codeword as soft information, e.g., LLR, can be insensitive to hard errors. Thus, existence of hard errors has no impact on the error correction capability of 2 bits soft decoding of new candidate codeword generated by HB_RAID. In contrast, existence of hard errors does impact on error correction capability of 2 bits soft decoding that is based on soft channel sampling. For example, assuming that the target (erroneous) codeword $y_0$ and another (erroneous) codeword $y_i$ are the only codewords that cannot be hard decoded successfully, two cases are considered—(1) in the first case, there are no hard errors at all, and (2) in the second case, 40% of the errors are hard-errors. Experiment results show that on average, the error correction capability of 2 bits soft decoder which is based on channel soft sampling is decreased in the second case compared to the first case, while the error correction capability of HB_RAID is the same in the first case and the second case, on average.

In some embodiments, the latency of HB_RAID may be shorter than that of a conventional 2 bits soft decoding. This gain can be achieved by arranging the RAID components (e.g., short codewords) in the flash device in a manner that they could be extracted in parallel. As described above with reference to FIG. 4A, the overall latency of soft sampling process is order of 3 times T-read (omitted other shorter time periods). However, in some embodiments where RAID components are arranged in the flash device in a manner that they could be extracted in parallel (for example, the short codewords of RAID are stored on same pages, but on different NAND channels or different NAND dies or NAND planes), the T-read time (which most contributes the overall latency) can be reduced by reading in parallel from all codewords and streaming data-out from different channels in parallel, so that only data-out from codewords on the same channel can be counted serially. Thus, the most significant time (i.e., T-read) may be counted in parallel, and the overall latency of the process that prepares the new codeword candidate in HB_RAID may be order of 1 time T-read.

Figure 11:
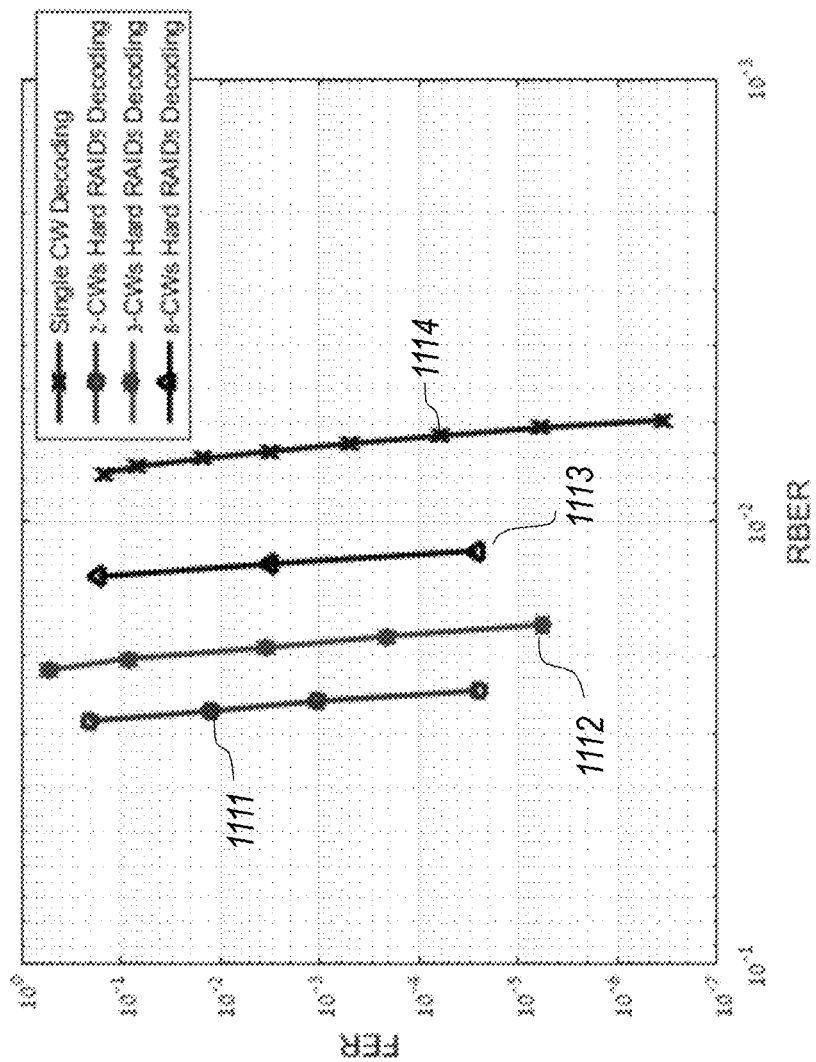
FIG. 11 is a diagram illustrating an example result of comparing a performance gain obtained with a conventional method with a performance gain obtained with a decoding method according to some embodiments.

FIG. 11 is a diagram illustrating an example result of comparing a performance gain obtained with a conventional method with a performance gain obtained with a decoding method according to some embodiments (HB_RAID). The x-axis in FIG. 11 is a residual bit error rate (RBER) used in a hard-read decoding, and the y-axis is a corresponding frame error rate (FER).

FIG. 11 shows the benefit of performing HB_RAID, according to some embodiments. It is assumed that at a specific BER point, all codewords (short codeword) experience the same BER distribution, and each curve (i.e., curves 1111, 1112, 1113, 1114) shows the capability under different number of hard decoding failed codewords. The curve 1114 indicates the error correction capability of a single hard decoding of a target codeword (without generating an estimated codeword). The other curves represent the error correction capability in cases of HB_RAID with a different number of failed codewords in RAID (the curves 1111, 1112, 1113 correspond to 2/3/8 number of failed codewords, respectively). It can be seen that the error correction capability of HB_RAID (i.e., the curves 1111, 1112, 1113) is significantly improved over the error correction capability of a single hard decoding (i.e., the curve 1114).

Embodiments of the present disclosure are not limited to the above-described method (HB_RAID). In some embodiments, the target codeword $x_0$ is not necessarily the first codeword in RAID. In some embodiments, $y_1 \ldots y_p$ are not necessarily consecutive in RAID, and $y_{p+1} \ldots y_n$ are not necessarily consecutive in RAID.

In some embodiments, the $L_a$ and $L_b$ of $y_{0\_EST}$ (e.g., $L_a$ and $L_b$ values shown in FIG. 10) can be weighted according to the number of failed short codeword(s) in the RAID. Generally speaking, the less number of failed codewords in the array, the estimator codeword information is more reliable. Since the number of bits in the new candidate codeword with LLR values $L_a$ is proportional to the number of failed codewords in the RAID, optimizing values of $L_a$ and $L_b$ using weights according to the number of failed short codewords may improves the soft decoding error correction capabilities.

In some embodiments, there is a tradeoff between the total code rate $R_{raid}$, which depends on R (code rate for each (short) codeword) and n (number of codewords in RAID).

$$R_{raid} = \frac{n}{(n+1)} \cdot R \qquad \text{(Equation 5)}$$

That is, as n becomes smaller, the probability for the number of codewords in the RAID that cannot be decoded successfully may decrease, thereby increasing the error correction capability of HB_RAID. On the other hand, as n becomes smaller, $R_{raid}$ may decrease, thereby requiring more bits of memory to be reserved to parity bits. In some embodiments, a trade-off between the total code rate $R_{raid}$ and the error correction capability of HB_RAID can be utilized by adjusting the total code rate $R_{raid}$ and the number of codewords in RAID.

In some embodiments, when a target codeword fails on hard decoding and some (other) codewords in RAID fail on hard decoding, the failed codewords may be partial decoded, e.g., only a portion of all the failed codewords may be decoded. Here, "partially decoding" means decoding (or fixing) some bits of a single failed codeword. If some bits can be fixed in the short codeword, although it is useless for the short codeword, such partially decoding or fixing may help the RAID decoding. Generally, partial hard decoding is useless, since all errors are fixed only if the full codeword could be decoded successfully. However, in HB_RAID, the short codewords decoding and the RAID decoding are mutually used, and thus, it is useful to partially correct some of the codewords (if possible), since this process may improve the total capability of HB_RAID.

In some embodiments, a flash memory system (e.g., flash memory system 700 in FIG. 7, flash memory system 800 in FIG. 8) may include a flash memory (e.g., flash memory module 704 in FIG. 7, flash memory module 804 in FIG. 8) and a circuit (e.g., memory controller 702 or read circuit 710 in FIG. 7, memory controller 802 or read circuit 810 or RAID controller 840 in FIG. 8) for decoding a result of a read operation on the flash memory using a first codeword (e.g., codeword $x_0$ in FIG. 9). The circuit may be configured to generate an estimated codeword (e.g., $y_{0\_EST}$ in Equation 8) based on a result of hard decoding the first codeword (e.g., erroneous target codeword $y_0$) and a result of hard decoding a second codeword (e.g., erroneous codeword $y_k$ in Equation 8). The circuit may be further configured to generate soft information (e.g., $y_{0,LLR\_IN}$ in Equation 9) based on the hard decoding result of the first codeword (e.g., erroneous target codeword $y_0$ in Equation 9) and the estimated codeword (e.g., $y_{0\_EST}$ in Equation 9). The circuit may be further configured to decode the result of the read operation on the flash memory using the soft information.

In some embodiments, the flash memory system may further include a redundant array of inexpensive disks (RAID) of the flash memory (e.g., flash memory module 804 including RAID in FIG. 8). The second codeword may be a plurality of codewords (e.g., $y_1 \ldots y_p$ in Equation 10) other than the first codeword in the RAID of the flash memory.

In some embodiments, the soft information (e.g., $y_{0,LLR\_IN}$ in Equation 9) may include log-likelihood ratio (LLR) values (e.g., $L_a$ and $L_b$ in Equation 9).

In some embodiments, in generating the estimated codeword, the circuit may be configured to determine whether the first codeword fails or succeeds in hard decoding in the flash memory, and generate, in response to determining that the first codeword fails in hard decoding, the estimated codeword based on the result of hard decoding the first codeword and the result of hard decoding the second codeword.

In some embodiments, in generating the estimated codeword, the circuit may be configured to generate an erroneous codeword of the first codeword (e.g., erroneous target codeword $y_0$) based on the hardcoding result of the first codeword. The second codeword may include at least one failed codeword (e.g., $y_k$ or $x_k$ in Equation 8) other than the first codeword that fails in hard decoding in the flash memory, and at least one successful codeword (e.g., $x_1$-$x_{n-1}$ except $x_k$ in Equation 8) other than the first codeword that succeeds in hard decoding in the flash memory. In generating the estimated codeword, the circuit may be configured to generate at least one erroneous codeword (e.g., $y_k$ in Equation 8) of the at least one failed codeword based on a result of hard decoding the at least one failed codeword, and generate the estimated codeword based on the erroneous codeword of the first codeword (e.g., erroneous target codeword $y_0$), the at least one erroneous codeword of the at least one failed codeword (e.g., $y_k$ in Equation 8), and the at least one successful codeword (e.g., $x_1$-$x_{n-1}$ except $x_k$ in Equation 8). The circuit may be configured to generate the estimated codeword by performing XOR operations (e.g., Equation 8) on the at least one erroneous codeword of the at least one failed codeword (e.g., $y_k$ in Equation 8) and the at least one successful codeword (e.g., $x_1$-$x_{n-1}$ except $x_k$ in Equation 8).

In some embodiments, in generating the soft information, the circuit may be configured to compare the estimated codeword (e.g., $y_{0\_EST}$ in Equation 9) with the erroneous codeword of the first codeword (e.g., erroneous target codeword $y_0$), and generate the soft information (e.g., $y_{0,LLR\_IN}$ in Equation 9) based on a result of the comparison (e.g., Equation 9). In generating the soft information based on a result of the comparison, the circuit may be configured to determine whether the estimated codeword is equal to the erroneous codeword, generate, in response to determining that the estimated codeword is equal to the erroneous codeword, the soft information based on similar hard decisions between the first codeword and the estimated codeword (e.g., $L_a$ in Equation 9), and generate, in response to determining that the estimated codeword is different from the erroneous codeword, the soft information based on different hard decisions between the first codeword and the estimated codeword (e.g., $L_b$ in Equation 9).

In some embodiments, the soft information may have a sign and an absolute value. In generating the soft information, the circuit may be configured to set the sign of the soft information (e.g., SIGN ($y_{0,LLR\_IN}$)) to a sign of the erroneous codeword of the first codeword (e.g., SIGN ($y_0$)). The circuit may be configured to determine whether the sign of the erroneous codeword is the same as or different from a sign of the estimated codeword, set, in response to determination that the sign of the erroneous codeword is the same as the sign of the estimated codeword, the absolute value of the soft information (e.g., ABS ($y_{0,LLR\_IN}$)) to a first value, and set, in response to determination that the sign of the erroneous codeword is different from the sign of the estimated codeword, the absolute value of the soft information (e.g., ABS ($y_{0,LLR\_IN}$)) to a second value that is smaller than the first value.

Figure 12:
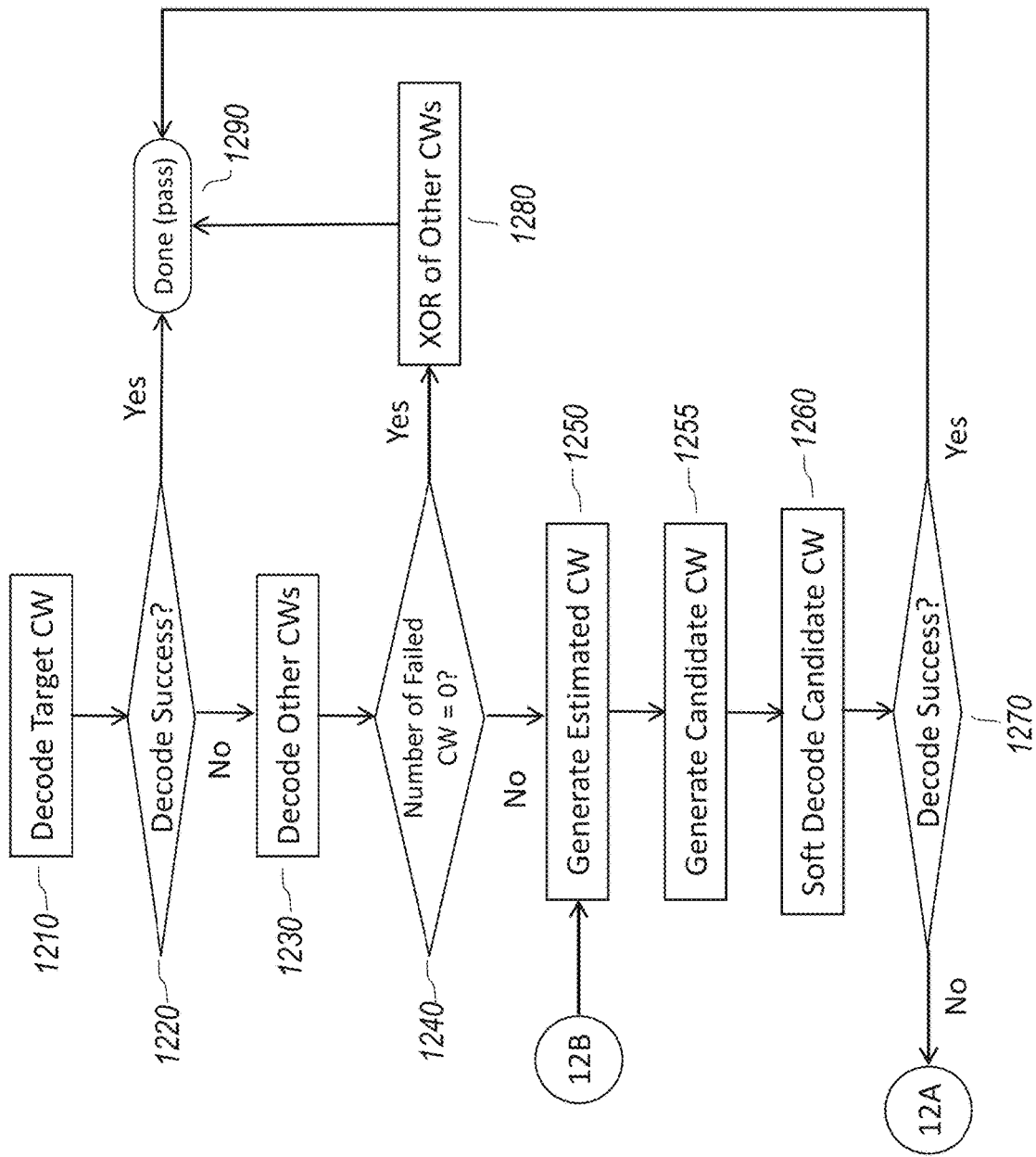
FIG. 12 and FIG. 13 are flowcharts illustrating an example methodology for soft decoding a result of a read operation on a flash memory based on results of hard decoding according to some embodiments.
Figure 13:
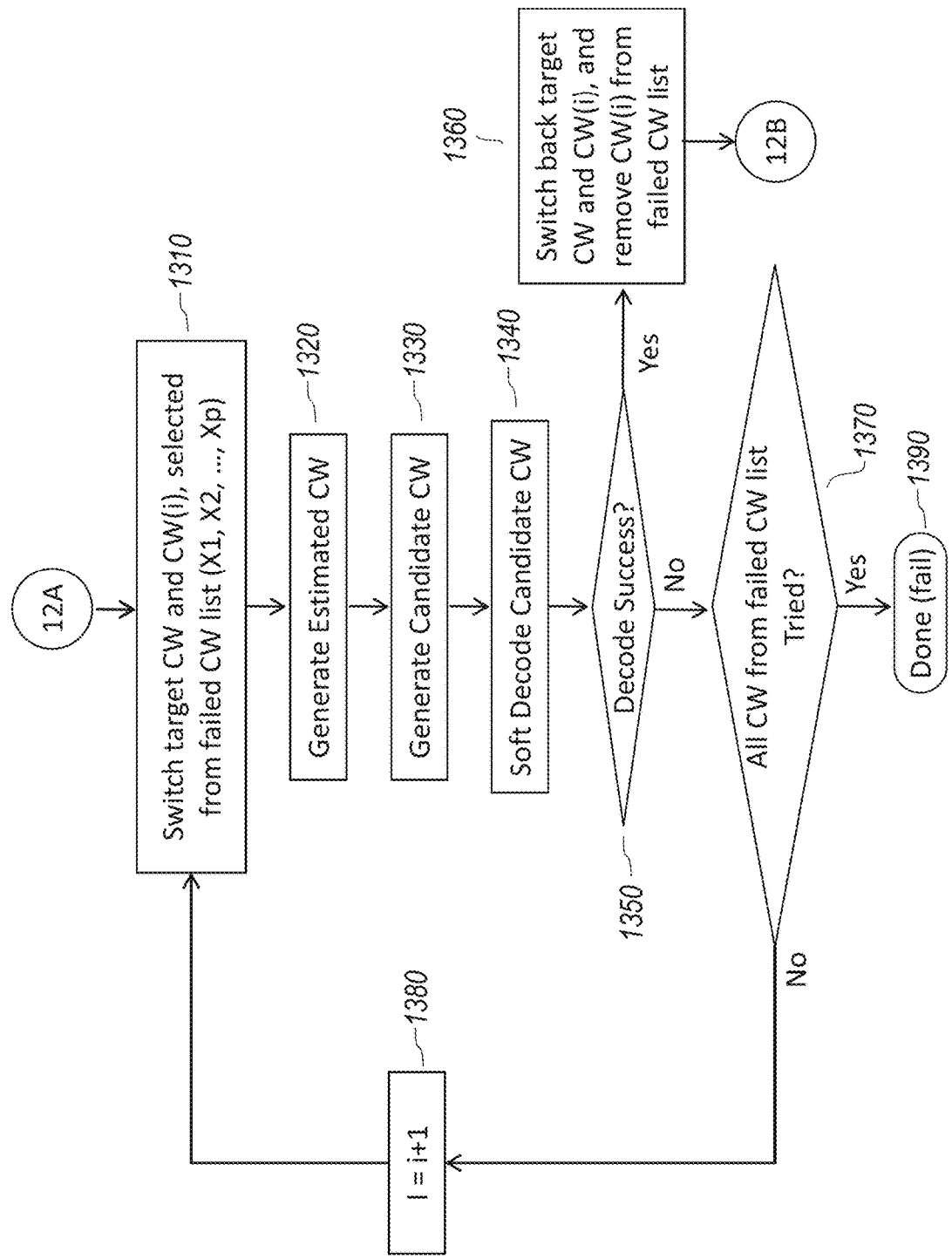

FIG. 12 and FIG. 13 are a flowchart illustrating an example methodology for soft decoding a result of a read operation on a flash memory based on results of hard decoding according to some embodiments. The example methodology shown in FIG. 12 and FIG. 13 (hereinafter "Re-ordering HB_RAID") uses dynamic re-order (or successive-raid-decoding) of RAID codewords in order to improve the overall error correction capability of hard decoding based soft decoding according to some embodiments.

In this example, referring to FIG. 12, the process begins in step S1210 by attempting to perform hard decoding on a target codeword (e.g., $x_0$ in FIG. 9) among a plurality of codewords in RAID (e.g., $x_0, \ldots, x_n$ in FIG. 9). In step S1220, in some embodiments, it may be determined whether the target codeword fails on hard decoding ("No") or the target codeword succeeds on hard decoding ("Yes"). If "Yes", the process may complete in step S1290 because the target codeword has passed hard decoding. If "No", the process may proceed to step S1230.

In step S1230, in some embodiments, it may be attempted to perform hard decoding on codewords other than the target codeword (e.g., $x_1, \ldots, x_n$ in FIG. 9). In step S1240, in some embodiments, it may be determined whether the number of failed codewords is zero ("Yes") or is greater than zero ("No"). If "Yes", the process may proceed to step S1280 to perform RAID decoding by XOR operations on all the codewords other than the target codeword (e.g., $x_1, \ldots, x_{n-1}$ in FIG. 9) and then the process may proceed to step S1290 to complete. If "No", the process may proceed to step S1250.

In step S1250, in some embodiments, an estimated codeword may be calculated or computed using Equation 10. For example, if $y_0$ is an erroneous target codeword that fails on hard decoding, $y_p$ are erroneous codewords that fail on hard decoding, and $x_{p+1}, \ldots, x_n$ are codewords that are successfully hard coded, the estimated codeword may be computed by calculating $y_{0\_EST}=(y_1 \oplus y_2 \ldots \oplus y_p \oplus x_{p+1} \ldots \oplus x_n)$. In step S1255, in some embodiments, a candidate codeword as soft information (e.g., LLRs) may be calculated or computed using Equation 9. In step S1260, in some embodiments, it may be attempted to perform soft decoding on the candidate codeword. In step S1270, in some embodiments, it may be determined whether the candidate codeword fails on soft decoding ("No") or the candidate codeword succeeds on soft decoding ("Yes"). If "Yes", the process may complete in step S1290 because the candidate codeword has passed soft decoding. If "No", the process may proceed to step S1310 (see FIG. 13).

Referring to FIG. 13, a codeword CW(i) may be selected from among failed codeword list (e.g., $y_1, \ldots, y_p$) and the target codeword may be switched to the selected codeword CW(i). In step S1320, in some embodiments, an estimated codeword may be calculated or computed based on the new target codeword CW(i) using Equation 10. For example, if i=1, and $y_1$ is a (new) erroneous target codeword that fails on hard decoding, $y_0, y_2, \ldots, y_p$ are erroneous codewords that fail on hard decoding, and $x_{p+1}, \ldots, x_n$ are codewords that are successfully hard coded, the estimated codeword may be computed by calculating $y_{1\_EST}=(y_0 \oplus y_2 \ldots y_p \oplus x_{p+1} \ldots \oplus x_n)$. In step S1330, in some embodiments, a (new) candidate codeword as soft information (e.g., LLRs) may be calculated or computed based on the new target codeword CW(i) using Equation 9. In step S1340, in some embodiments, it may be attempted to perform soft decoding on the (new) candidate codeword. In step S1350, in some embodiments, it may be determined whether the (new) candidate codeword fails on soft decoding ("No") or the (new) candidate codeword succeeds on soft decoding ("Yes"). If "Yes", the process may switch back the original target codeword and CW(i), and remove CW(i) from the failed codeword list in step S1360 and may proceed to step S1250 (see FIG. 12). If "No", the process may proceed to step S1370 (see FIG. 13).

In step S1370, in some embodiments, it may be determined whether all codewords from the failed codeword list have been switched with the target codeword ("Yes") or there remain any codeword in the failed codeword list that has not been switched with the target codeword ("No"). If "Yes", the process may complete in step S1390 because the target codeword has failed on decoding. If "No", the process may increase the value of I to select another codeword from the failed codeword list, and then repeat steps 1310 through 1370 until all codewords from the failed codeword list have been switched with the target codeword.

The error correction capability of the Re-ordering HB_RAID method (as shown in FIG. 12 and FIG. 13) is improved over the original HB_RAID method for the following reasons. Consider the example that $y_0$ is an erroneous target codeword that fails on hard decoding and that erroneous codewords $y_1, \ldots, y_p$ fail on hard decoding, and $x_{p+1}, \ldots, x_n$ are extracted by successful hard decoding of $y_{p+1}, \ldots, y_n$. It is also assumed that the erroneous target codeword $y_0$ has relatively high BER among $y_1, \ldots, y_p$ and another erroneous codeword $y_1$ has relatively low BER that is lower than that of $y_0$ (without loss of generality).

Now consider that after HB_RAID process is performed in steps 1210 through 1270 (see FIG. 12), the new candidate codeword cannot be successfully decoded (i.e., "No" in step S1270). Since the sign of the new candidate codeword is set according to the sign of the target codeword (as explained above), if the target codeword $y_0$ is switched with the codeword $y_1$, and HB_RAID is performed again (in steps 1310 through 1350 in FIG. 13), this time the BER of the new candidate codeword generated based on the new target codeword $y_1$ will be smaller than the BER of the original candidate codeword generated based on the original target codeword $y_0$. Hence, the soft decoding of this new candidate codeword may be likely decoded successfully, and then $y_1$ (or $x_1$) can be removed from the failed codeword list in step S1360, and the RAID_HB on the original target codeword $x_0$ can be performed again in steps 1250 through 1270. At this time, the number of failed codewords in RAID is reduced by one, hence the new candidate codeword will have reduced BER, and RAID_HB may likely complete successfully. This flow of the Re-ordering HB_RAID method (as shown in FIG. 12 and FIG. 13) may continue until the target codeword is decoded successfully in step S1290, or until the re-order process covered all failed codewords in the RAID in step S1390.

In some embodiments, the Re-ordering HB_RAID method may be implemented with low complexity. During each re-order iteration (i.e., a trial with a different $i^{th}$ failed codeword), instead of changing the new candidate codeword by LLR, only the sign of the candidate codeword may be set according to the sign of the new target codeword. This implementation method can save the process of re-building the estimated codeword and the LLRs of the new candidate codeword (in steps 1320 through 1340 in FIG. 13) in each iteration.

Figure 14:
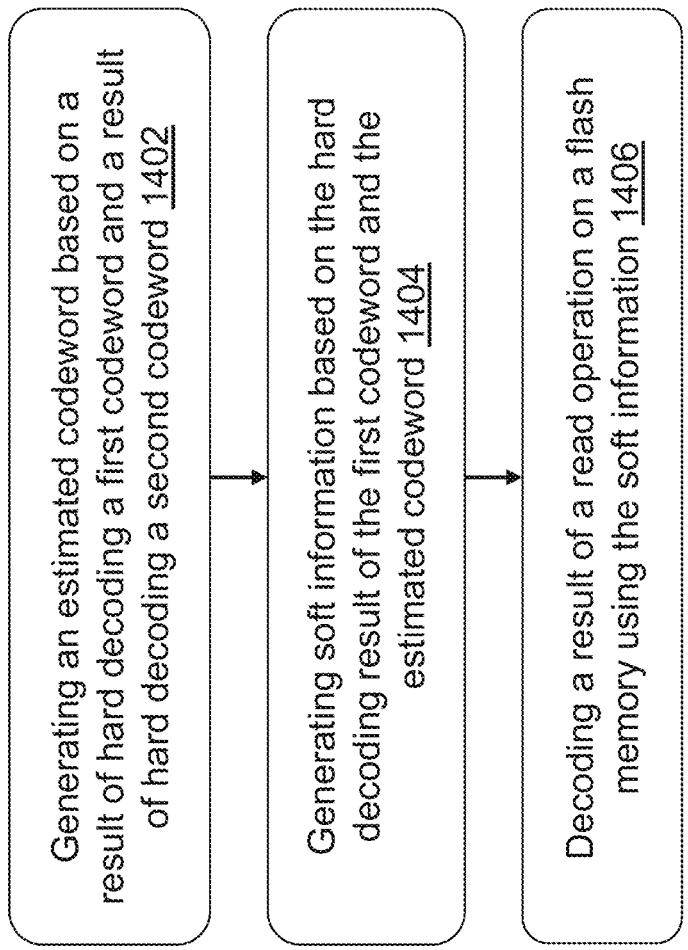
FIG. 14 is a flowchart illustrating an example methodology for decoding a result of a read operation on a flash memory based on soft information according to some embodiments.

FIG. 14 is a flowchart illustrating an example methodology for decoding a result of a read operation on a flash memory based on soft information according to some embodiments. In some embodiments, the example methodology relates to a method for decoding a result of a read operation on a flash memory (e.g., flash memory module 704 in FIG. 7, flash memory module 804 in FIG. 8) using a first codeword (e.g., codeword $x_0$ in FIG. 9.

In this example, the process begins in step S1402 by generating an estimated codeword (e.g., $y_{0\_EST}$ in Equation 8) based on a result of hard decoding the first codeword (e.g., erroneous target codeword $y_0$) and a result of hard decoding a second codeword (e.g., erroneous codeword $y_k$ in Equation 8). In some embodiments, the second codeword may be a plurality of codewords (e.g., $y_1 \ldots y_p$ in Equation 10) other than the first codeword in a redundant array of inexpensive disks (RAID) of the flash memory (e.g., flash memory module 804 including RAID in FIG. 8). In some embodiments, the soft information (e.g., $y_{0,LLR\_IN}$ in Equation 9) may include log-likelihood ratio (LLR) values (e.g., $L_a$ and $L_b$ in Equation 9).

In some embodiments, in generating the estimated codeword, it may be determined whether the first codeword fails or succeeds in hard decoding in the flash memory (e.g., S1220 in FIG. 12). In response to determining that the first codeword fails in hard decoding, the estimated codeword may be generated based on the result of hard decoding the first codeword and the result of hard decoding the second codeword (e.g., S1250 in FIG. 12).

In some embodiments, in generating the estimated codeword, an erroneous codeword of the first codeword (e.g., erroneous target codeword $y_0$) may be generated based on the hardcoding result of the first codeword. The second codeword may include at least one failed codeword (e.g., $y_k$ or $x_k$ in Equation 8) other than the first codeword that fails in hard decoding in the flash memory and at least one successful codeword (e.g., $x_1$-$x_{n-1}$ except $x_k$ in Equation 8) other than the first codeword that succeeds in hard decoding in the flash memory. In generating the estimated codeword, at least one erroneous codeword (e.g., $y_k$ in Equation 8) of the at least one failed codeword may be generated based on a result of hard decoding the at least one failed codeword. The estimated codeword may be generated based on the erroneous codeword of the first codeword (e.g., erroneous target codeword $y_0$), the at least one erroneous codeword of the at least one failed codeword (e.g., $y_k$ in Equation 8), and the at least one successful codeword (e.g., $x_1$-$x_{n-1}$ except $x_k$ in Equation 8). The estimated codeword may be generated by performing XOR operations (e.g., Equation 8) on the at least one erroneous codeword of the at least one failed codeword (e.g., $y_k$ in Equation 8) and the at least one successful codeword (e.g., $x_1$-$x_{n-1}$ except $x_k$ in Equation 8).

In step S1404, in some embodiments, soft information (e.g., $y_{0,LLR\_IN}$ in Equation 9) may be generated based on the hard decoding result of the first codeword (e.g., erroneous target codeword $y_0$ in Equation 9) and the estimated codeword (e.g., $y_{0\_EST}$ in Equation 9).

In some embodiments, in generating the soft information, the estimated codeword (e.g., $y_{0\_EST}$ in Equation 9) may be compared with the erroneous codeword of the first codeword (e.g., erroneous target codeword $y_0$). The soft information (e.g., $y_{0,LLR\_IN}$ in Equation 9) may be generated based on a result of the comparison (e.g., Equation 9). In generating the soft information based on a result of the comparison, it may be determined whether the estimated codeword is equal to the erroneous codeword. In response to determining that the estimated codeword is equal to the erroneous codeword, the soft information may be generated based on similar hard decisions between the first codeword and the estimated codeword (e.g., $L_a$ in Equation 9). In response to determining that the estimated codeword is different from the erroneous codeword, the soft information may be generated based on different hard decisions between the first codeword and the estimated codeword (e.g., $L_b$ in Equation 9).

In some embodiments, the soft information may have a sign and an absolute value. In generating the soft information, the sign of the soft information (e.g., SIGN ($y_{0,LLR\_IN}$)) may be set to a sign of the erroneous codeword of the first codeword (e.g., SIGN ($y_0$)). It may be determined whether the sign of the erroneous codeword is the same as or different from a sign of the estimated codeword. In response to determination that the sign of the erroneous codeword is the same as the sign of the estimated codeword, the absolute value of the soft information (e.g., ABS ($y_{0,LLR\_IN}$)) may be set to a first value, and in response to determination that the sign of the erroneous codeword is different from the sign of the estimated codeword, the absolute value of the soft information (e.g., ABS ($y_{0,LLR\_IN}$)) may be set to a second value that is smaller than the first value.

In step S1406, in some embodiments, the result of the read operation on the flash memory may be decoded using the soft information (e.g., S1260 in FIG. 12).

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout the previous description that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

It is understood that the specific order or hierarchy of steps in the processes disclosed is an example of illustrative approaches. Based upon design preferences, it is understood that the specific order or hierarchy of steps in the processes may be rearranged while remaining within the scope of the previous description. The accompanying method claims present elements of the various steps in a sample order, and are not meant to be limited to the specific order or hierarchy presented.

The previous description of the disclosed implementations is provided to enable any person skilled in the art to make or use the disclosed subject matter. Various modifications to these implementations will be readily apparent to those skilled in the art, and the generic principles defined herein may be applied to other implementations without departing from the spirit or scope of the previous description. Thus, the previous description is not intended to be limited to the implementations shown herein but is to be accorded the widest scope consistent with the principles and novel features disclosed herein.

The various examples illustrated and described are provided merely as examples to illustrate various features of the claims. However, features shown and described with respect to any given example are not necessarily limited to the associated example and may be used or combined with other examples that are shown and described. Further, the claims are not intended to be limited by any one example.

The foregoing method descriptions and the process flow diagrams are provided merely as illustrative examples and are not intended to require or imply that the steps of various examples must be performed in the order presented. As will be appreciated by one of skill in the art the order of steps in the foregoing examples may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the examples disclosed herein may be implemented or performed with a general purpose processor, a DSP, an ASIC, an FPGA or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In some exemplary examples, the functions described may be implemented in hardware, software, firmware, or any combination thereof. If implemented in software, the functions may be stored as one or more instructions or code on a non-transitory computer-readable storage medium or non-transitory processor-readable storage medium. The steps of a method or algorithm disclosed herein may be embodied in a processor-executable software module which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The preceding description of the disclosed examples is provided to enable any person skilled in the art to make or use the present disclosure. Various modifications to these examples will be readily apparent to those skilled in the art, and the generic principles defined herein may be applied to some examples without departing from the spirit or scope of the disclosure. Thus, the present disclosure is not intended to be limited to the examples shown herein but is to be accorded the widest scope consistent with the following claims and the principles and novel features disclosed herein.

What is claimed is:

1. A method for decoding a result of a read operation on a flash memory using a first codeword, the method comprising:
    obtaining a failing result of hard decoding of the first codeword;
    obtaining a successful result of hard decoding of a second codeword, wherein the second codeword is stored in a different data block than the first codeword;
    generating an estimated codeword based on the result of hard decoding the first codeword and the result of hard decoding the second codeword, wherein generating the estimated codeword includes determining values of one or more bits of the estimated codeword using bits from the obtained result of hard decoding of the first codeword and the obtained result of hard decoding of the second codeword;
    generating soft information based on the hard decoding result of the first codeword and the estimated codeword; and
    decoding the result of the read operation on the flash memory using the soft information.

2. The method of claim 1, wherein the second codeword is a plurality of codewords other than the first codeword in a redundant array of inexpensive disks (RAID) of the flash memory.

3. The method of claim 1, wherein the soft information comprises log-likelihood ratio (LLR) values.

4. The method of claim 1, wherein generating the estimated codeword comprises:
    in response to determining that the first codeword fails in hard decoding, generating the estimated codeword based on the result of hard decoding the first codeword and the result of hard decoding the second codeword.

5. The method of claim 1, wherein
    generating the estimated codeword comprises generating an erroneous codeword of the first codeword based on the hard decoding result of the first codeword.

6. The method of claim 5, wherein the second codeword comprises:
    at least one failed codeword other than the first codeword that fails in hard decoding in the flash memory,
    wherein generating the estimated codeword comprises:
        generating at least one erroneous codeword of the at least one failed codeword based on a result of hard decoding the at least one failed codeword; and
        generating the estimated codeword based on the erroneous codeword of the first codeword and the at least one erroneous codeword of the at least one failed codeword.

7. The method of claim 6, wherein the estimated codeword is generated by performing XOR operations on the at least one erroneous codeword of the at least one failed codeword.

8. The method of claim 5, wherein generating the soft information comprises:
    comparing the estimated codeword with the erroneous codeword of the first codeword; and generating the soft information based on a result of the comparison.

9. The method of claim 8, wherein generating the soft information based on a result of the comparison comprises:
   determining whether the estimated codeword is equal to the erroneous codeword;
   in response to determining that the estimated codeword is equal to the erroneous codeword, generating the soft information based on similar hard decisions between the first codeword and the estimated codeword; and
   in response to determining that the estimated codeword is different from the erroneous codeword, generating the soft information based on different hard decisions between the first codeword and the estimated codeword.

10. The method of claim 5, wherein
   the soft information has a sign and an absolute value, and generating the soft information comprises:
   setting the sign of the soft information to a sign of the erroneous codeword of the first codeword;
   determining whether the sign of the erroneous codeword is the same as or different from a sign of the estimated codeword;
   in response to determination that the sign of the erroneous codeword is the same as the sign of the estimated codeword, setting the absolute value of the soft information to a first value; and
   in response to determination that the sign of the erroneous codeword is different from the sign of the estimated codeword, setting the absolute value of the soft information to a second value that is smaller than the first value.

11. A flash memory system comprising:
   a flash memory; and
   a circuit for decoding a result of a read operation on the flash memory using a first codeword, the circuit being configured to:
   obtain a failing result of hard decoding of the first codeword;
   obtain a successful result of hard decoding of a second codeword, wherein the second codeword is stored in a different data block than the first codeword;
   generate an estimated codeword based on the result of hard decoding the first codeword and the result of hard decoding the second codeword, wherein generating the estimated codeword includes determining values of one or more bits of the estimated codeword using bits from the obtained result of hard decoding of the first codeword and the obtained result of hard decoding of the second codeword;
   generate soft information based on the hard decoding result of the first codeword and the estimated codeword; and
   decode the result of the read operation on the flash memory using the soft information.

12. The flash memory system of claim 11, further comprising:
   a redundant array of inexpensive disks (RAID) of the flash memory,
   wherein the second codeword is a plurality of codewords other than the first codeword in the RAID of the flash memory.

13. The flash memory system of claim 11, wherein the soft information comprises log-likelihood ratio (LLR) values.

14. The flash memory system of claim 11, wherein in generating the estimated codeword, the circuit is configured to:
   generate, in response to determining that the first codeword fails in hard decoding, the estimated codeword based on the result of hard decoding the first codeword and the result of hard decoding the second codeword.

15. The flash memory system of claim 11, wherein in generating the estimated codeword, the circuit is configured to generate an erroneous codeword of the first codeword based on the hard decoding result of the first codeword.

16. The flash memory system of claim 15, wherein
   the second codeword comprises:
   at least one failed codeword other than the first codeword that fails in hard decoding in the flash memory, and
   in generating the estimated codeword, the circuit is configured to:
   generate at least one erroneous codeword of the at least one failed codeword based on a result of hard decoding the at least one failed codeword; and
   generate the estimated codeword based on the erroneous codeword of the first codeword and the at least one erroneous codeword of the at least one failed codeword.

17. The flash memory system of claim 16, wherein the circuit is configured to generate the estimated codeword by performing XOR operations on the at least one erroneous codeword of the at least one failed codeword.

18. The flash memory system of claim 15, wherein in generating the soft information, the circuit is configured to:
   compare the estimated codeword with the erroneous codeword of the first codeword; and
   generate the soft information based on a result of the comparison.

19. The flash memory system of claim 18, wherein in generating the soft information based on a result of the comparison, the circuit is configured to:
   determine whether the estimated codeword is equal to the erroneous codeword;
   generate, in response to determining that the estimated codeword is equal to the erroneous codeword, the soft information based on similar hard decisions between the first codeword and the estimated codeword; and
   generate, in response to determining that the estimated codeword is different from the erroneous codeword, the soft information based on different hard decisions between the first codeword and the estimated codeword.

20. The flash memory system of claim 15, wherein
   the soft information has a sign and an absolute value, and
   in generating the soft information, the circuit is configured to:
   set the sign of the soft information to a sign of the erroneous codeword of the first codeword;
   determine whether the sign of the erroneous codeword is the same as or different from a sign of the estimated codeword;
   set, in response to determination that the sign of the erroneous codeword is the same as the sign of the estimated codeword, the absolute value of the soft information to a first value; and
   set, in response to determination that the sign of the erroneous codeword is different from the sign of the estimated codeword, the absolute value of the soft information to a second value that is smaller than the first value.

* * * * *